United States Patent
Tokuhiro

(10) Patent No.: US 8,020,022 B2
(45) Date of Patent: Sep. 13, 2011

(54) DELAY TIME CONTROL OF MEMORY CONTROLLER

(75) Inventor: Noriyuki Tokuhiro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 334 days.

(21) Appl. No.: 12/209,740

(22) Filed: Sep. 12, 2008

(65) Prior Publication Data

US 2009/0077411 A1  Mar. 19, 2009

(30) Foreign Application Priority Data

Sep. 18, 2007  (JP) ................................ 2007-241610

(51) Int. Cl.
*G06F 13/42* (2006.01)
(52) U.S. Cl. ........................................ 713/401; 713/601
(58) Field of Classification Search .......... 713/400–401, 713/500–501, 600–601
See application file for complete search history.

(56) References Cited

U.S. PATENT DOCUMENTS

| 7,412,616 | B2 * | 8/2008 | Matsui et al. ................. 713/401 |
| 7,796,465 | B2 * | 9/2010 | Swain et al. ............. 365/233.13 |
| 2005/0047192 | A1 | 3/2005 | Matsui et al. |
| 2005/0174878 | A1 | 8/2005 | Osaka et al. |

FOREIGN PATENT DOCUMENTS

| JP | 2003-099321 | 4/2003 |
| JP | 2005-078547 | 3/2005 |
| JP | 2005-209168 | 8/2005 |

* cited by examiner

*Primary Examiner* — Raymond Phan
(74) *Attorney, Agent, or Firm* — Staas & Halsey LLP

(57) ABSTRACT

A memory control circuit has a write leveling function and controls read/write operations by supplying a clock signal to a plurality of memories through a clock signal line which is wired to the plurality of memories through daisy chain connection. For each of the plurality of memories, a first variable delay unit delays, in a write operation, a data strobe signal output to the memory by a first delay time that is set by utilizing the write leveling function and a second variable delay unit delays, in a read operation, a data signal input from the memory by a second delay time that is set based on the first delay time.

16 Claims, 20 Drawing Sheets

DELAY TIME CONTROL OF MEMORY CONTROLLER

CROSS-REFERENCE TO RELATED APPLICATIONS

This application is related to and claims priority to Japanese patent application no. 2007-241610 filed on Sep. 18, 2007, in the Japan Patent Office, and incorporated by reference herein.

BACKGROUND

1. Field

The memory control circuit, delay time control device, and delay time control method relate to a technique for controlling read/write operations for a plurality of memories to which a clock signal line is wired through the daisy chain connection, as in, e.g., a DDR3 memory interface, by supplying a clock signal through the clock signal line.

2. Description of the Related Art

Recently, the DDR3 (Double Data Rate 3) memory interface has been standardized as standards of a DRAM (Dynamic Random Access Memory) by JEDEC (Joint Electron Device Engineering Council) (see, e.g., JDEC STANDARD (JESD79-3; DDR3 SDRAM Standard). Unlike the hitherto practiced DDR (Double Data Rate) memory interface and DDR2 (Double Data Rate 2) memory interface (see, e.g., Japanese Laid-open Patent Publication No. 2003-99321, No. 2005-78547, and No. 2005-209168), the DDR3 memory interface employs fly-by topology for connection between a memory controller and a DIMM (Dual Inline Memory Module).

FIG. 1 is a block diagram showing a configuration example of the recently proposed DDR3 memory interface, and FIG. 2 is a block diagram for explaining a write leveling operation in the DDR3 memory interface.

As shown in FIG. 1, for example, the fly-by topology is configured such that a signal line for each of a clock signal CK, an address signal Add and a command signal CMD is wired from a memory controller 90 to a plurality (number n) of SDRAMs (Synchronous Dynamic Random Access Memories) 92-1 to 92-n (n is a natural number of 2 or more) on a DIMM module 91 through the daisy chain connection. On the other hand, data signal lines for data signals DQ and data strobe signals DQS are wired from the memory controller 90 to the plurality of SDRAMs 92-1 to 92-n on the DIMM module 91, respectively.

In the following description, regarding characters denoting the SDRAMs, when one among the plurality of SDRAMs needs to be specified, any of characters 92-1 to 92-n is used, while a character 92 is used when an arbitrary SDRAM is to be indicated.

Also, regarding characters denoting the data signals, when one among the plurality of data signals needs to be specified, any of characters DQ-1 to DQ-n is used, while a character DQ is used when an arbitrary data signal is to be indicated.

Further, regarding characters denoting the data strobe signals, when one among the plurality of data strobe signals needs to be specified, any of characters DQS-1 to DQS-n is used, while a character DQS is used when an arbitrary data strobe signal is to be indicated.

Thus, in the DDR3 memory interface, because the clock signal line for the clock signal CK is wired to the plurality of SDRAMs 92-1 to 92-n through the daisy chain connection and a propagation delay is generated, the clock signal CK output from the memory controller 90 cannot reach all the SDRAMs 92-1 to 92-n at the same time. According to the JEDEC standards, for example, a length L1 of outer dimension of the DIMM module 91 is determined to be 133 mm. Assuming a data transmission speed to be 7 ps/mm, therefore, a difference of about 1 ns is generated in arrival time of the clock signal CK between the SDRAM 92-1 disposed at one end and the SDRAM 92-n disposed at the other end of the DIMM module 91 in the lengthwise direction thereof (namely, 7 ps/mm×133 mm=931 ps).

For that reason, according to the JEDEC standards, it is specified to employ the write leveling function in the DDR3 memory interface.

The term "write leveling function" refers to the function of sampling the clock signal CK by using the data strobe signal DQS output from the memory controller 90, detecting the phase relationship between the data strobe signal DQS and the clock signal CK, and adjusting (compensating) a delay time of the data strobe signal DQS. The write leveling function is realized, as shown in FIG. 2, by incorporating variable delay circuits 93-1 to 93-n, which can change respective delay times of the data strobe signals DQS-1 to DQS-n, in the memory controller 90 corresponding to the plurality of SDRAMs 92-1 to 92-n, respectively.

In the following description, regarding characters denoting the delay circuits, when one among the plurality of delay circuits needs to be specified, any of characters 93-1 to 93-n is used, while a character 93 is used when an arbitrary delay circuit is to be indicated.

More specifically, for the data strobe signals DQS-1 to DQS-n output respectively to the plurality of SDRAMs 92-1 to 92-n to which the clock signal line is wired through the daisy chain connection, a CPU (Central Processing Unit, not shown) sets respective delay times t1-1 to t1-n based on the data signals DQ-1 to DQ-n output from the plurality of SDRAMs 92-1 to 92-n so that the data strobe signals DQS-1 to DQS-n are adjusted to be input respectively to the plurality of SDRAMs 92-1 to 92-n substantially at the same time as the clock signal CK for each SDRAM.

In other words, for example, at the time of completion of the write leveling, the data strobe signals DQS are delayed through the respective delay times t1-1 to t1-n in the delay circuits 93-1 to 93-n which correspond to the SDRAMs 92-1 to 92-n on the DIMM module 91, respectively, whereby the data strobe signal DQS and the clock signal CK are input in phase to each of the SDRAMs 92-1 to 92-n.

Thus, in the DDR3 memory interface, the difference in the delay time caused in the write operations between the memory controller 90 and the plurality of SDRAMs 92 is adjusted by employing the write leveling function.

Additionally, in the above-described case, the delay times t1-1 to t1-n are not equal to each other because the clock signal CK is input to the SDRAMs 92-1 to 92-n via the clock signal line through the daisy chain connection.

Although, the DDR3 memory interface compensates the arrival time when the data strobe signals DQS-1 to DQS-n arrive at the SDRAMs 92-1 to 92-n in the write operations according to the JEDEC standards as described above, compensations of the signal arrival time in read operations are not provided with the JEDEC standards.

FIG. 3 is a block diagram explaining the read operation of the conventional DDR3 memory interface.

The SDRAMs 92-1 though 92-n output data signals DQ-1 though DQ-n and the data strobe signals DQS-1 through DQS-n to the memory controller 90 on receiving the clock signal CK output from the memory controller 90 via the data signal line in the daisy chain connection in the read operation as shown in FIG. 3.

Therefore, the data signal DQ-n and the data strove signal DQS-n output from the SDRAM 92-n to which the clock signal CK is input lastly arrives at the memory controller 90 approximately 1 ns after the data signal DQ-1 and the data strobe signal DQS-1 output from the SDRAM 92-1 to which the clock signal CK is input firstly where the data transmission speed is 7 ps/mm as the case described above. 7 ps/mm× 133 mm=931 ps.

The delay on the order of 1 ns will become greater than a typical data period of the DDR3 memory interface, at minimum 0.625 ns, so that the delay may affect in reading data from the SDRAM 92.

SUMMARY

A memory control circuit having a write leveling function and controlling read/write operations by supplying a clock signal to a plurality of memories through a clock signal line which is wired to the plurality of memories through daisy chain connection is comprising, for each of the plurality of memories, a first variable delay unit for delaying, in the write operation, a data strobe signal output to the memory by a first delay time that is set by utilizing the write leveling function and a second variable delay unit for delaying, in the read operation, a data signal input from the memory by a second delay time that is set based on the first delay time.

Additional objects and advantages of the embodiment will be set forth in part in the description which follows, and in part will be obvious from the description, or may be learned by practice of the embodiment. The object and advantages of the embodiment will be realized and attained by the elements and combinations particularly pointed out in the appended claims.

It is to be understood that both the foregoing general description and the following detailed description are exemplary and explanatory only and are not restrictive of the embodiment, as claimed.

These together with other aspects and advantages which will be subsequently apparent, reside in the details of construction and operation as more fully hereinafter described and claimed, reference being had to the accompanying drawings forming a part hereof, wherein like numerals refer to like parts throughout.

DETAILED DESCRIPTION OF THE PREFERRED EMBODIMENTS

Embodiments will be described below with reference to the drawings.

[1] First Embodiment

Figure 1:
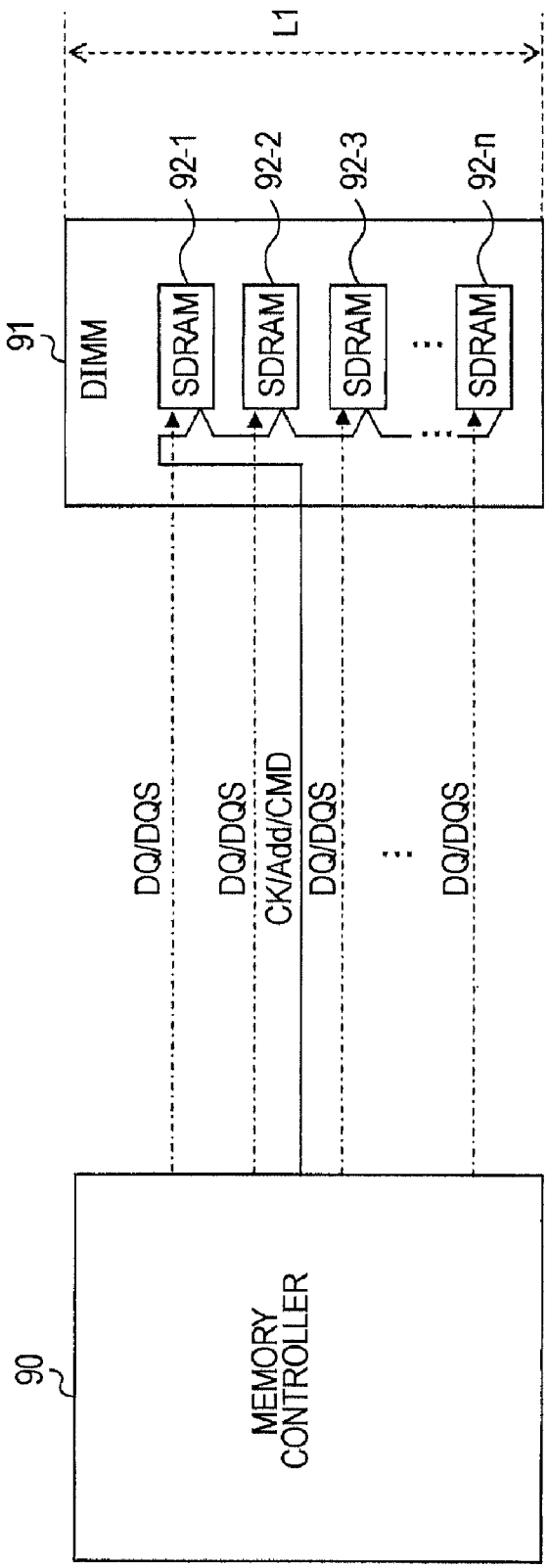
FIG. 1 is a block diagram showing a configuration example of the known DDR3 memory interface.
Figure 2:
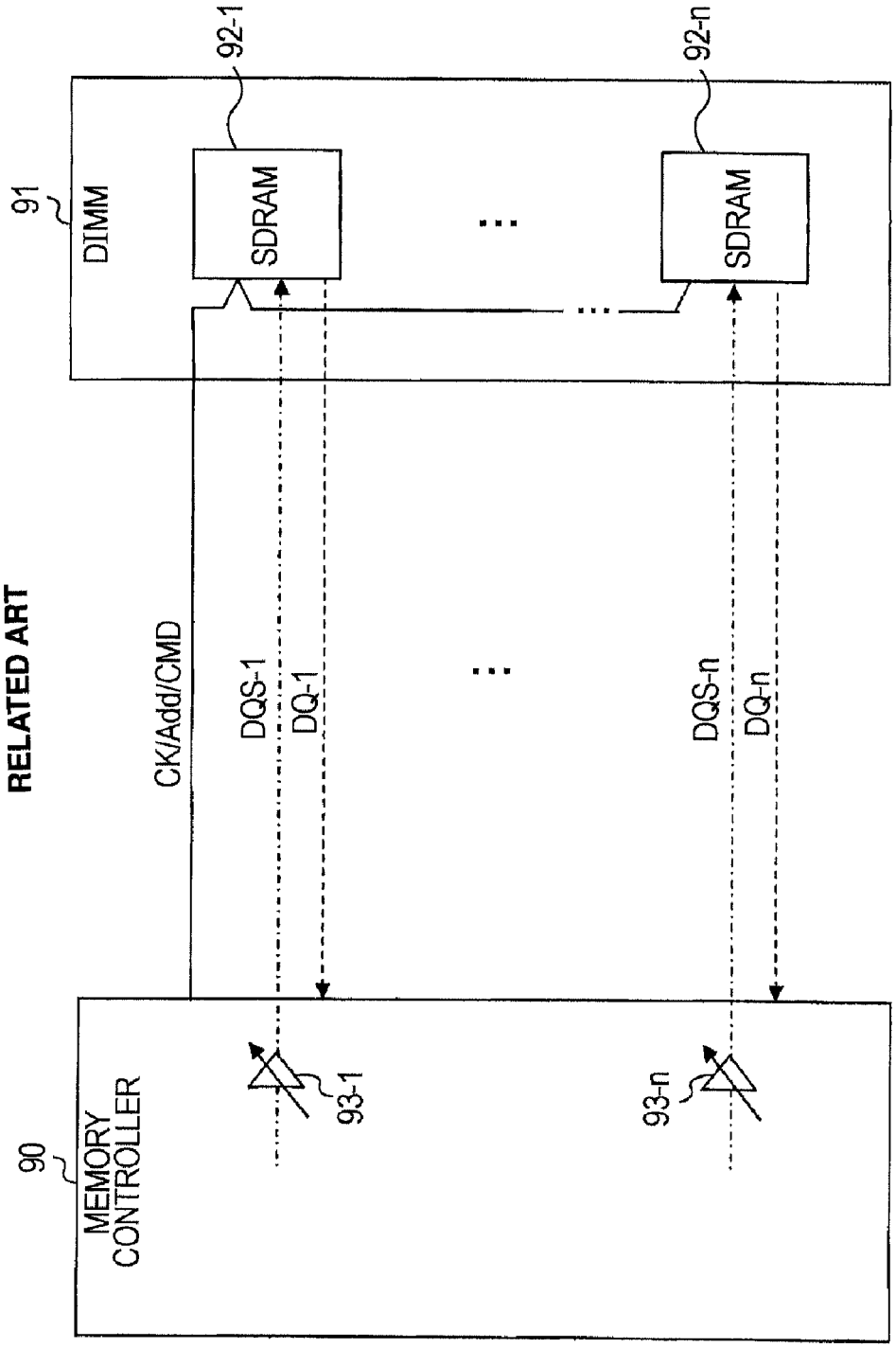
FIG. 2 is a block diagram for explaining a write leveling operation in the known DDR3 memory interface.
Figure 3:
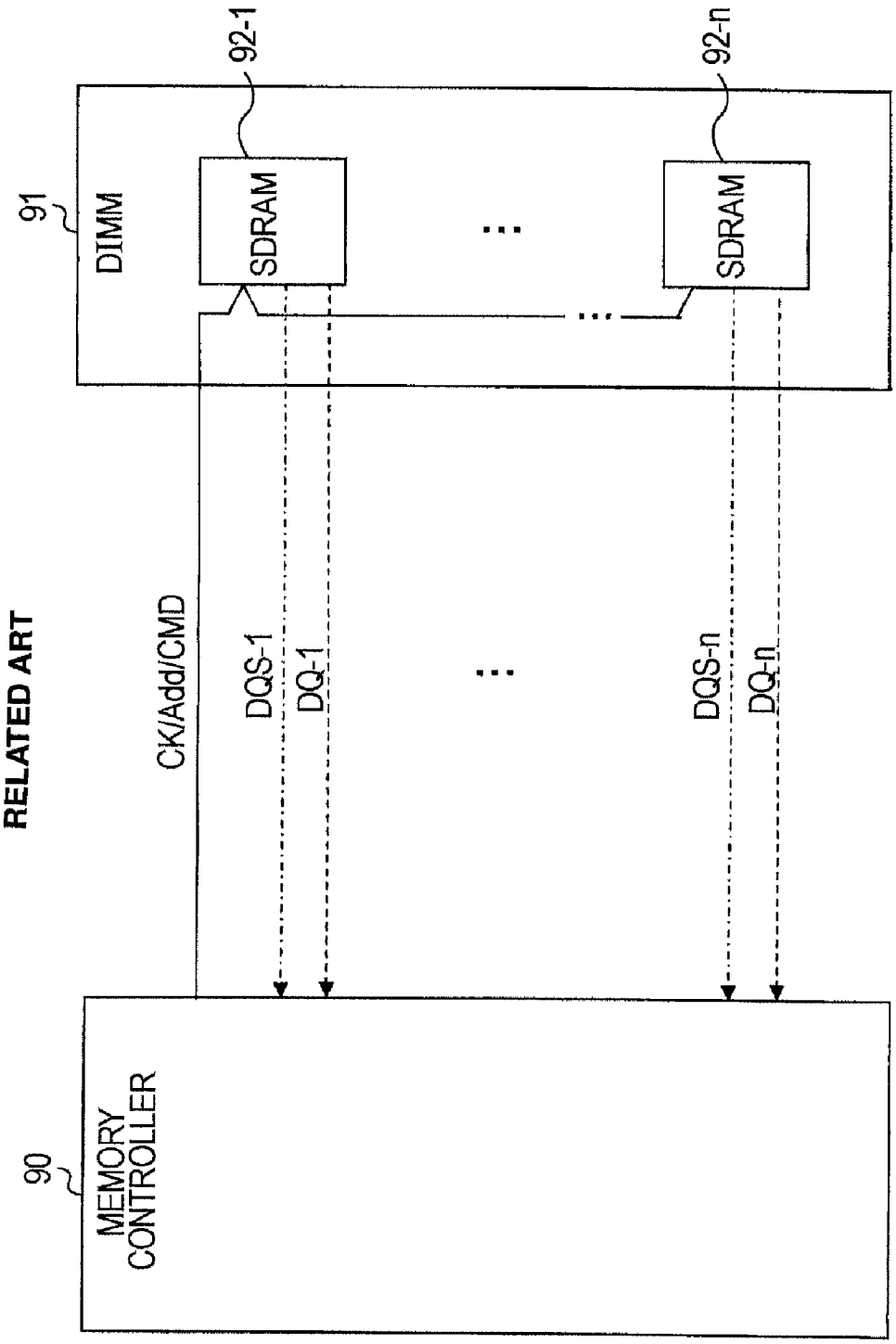
FIG. 3 is a block diagram for explaining a read operation in the known DDR3 memory interface.
Figure 4:
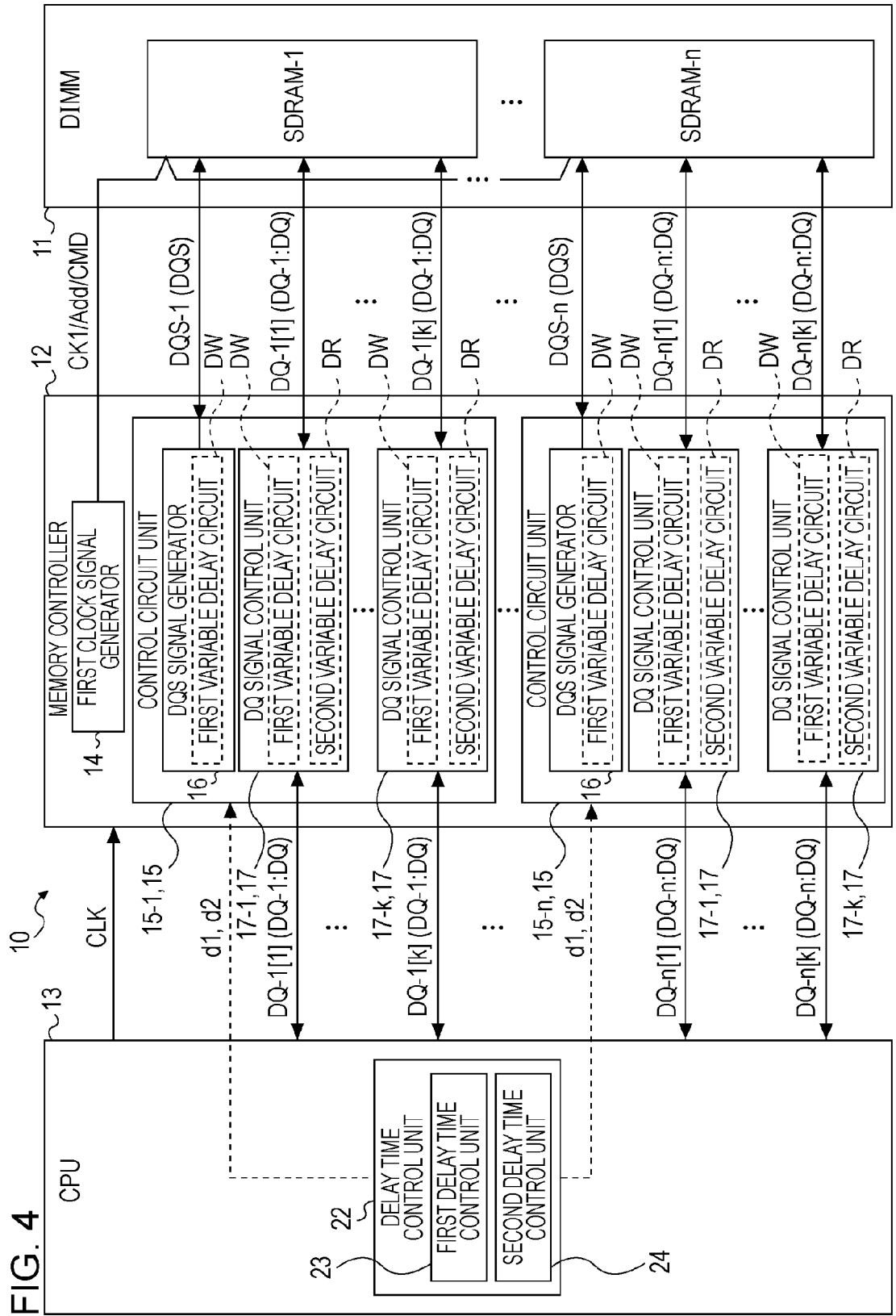
FIG. 4 is a block diagram showing a configuration example of an information processing apparatus according to a first embodiment.
Figure 5:
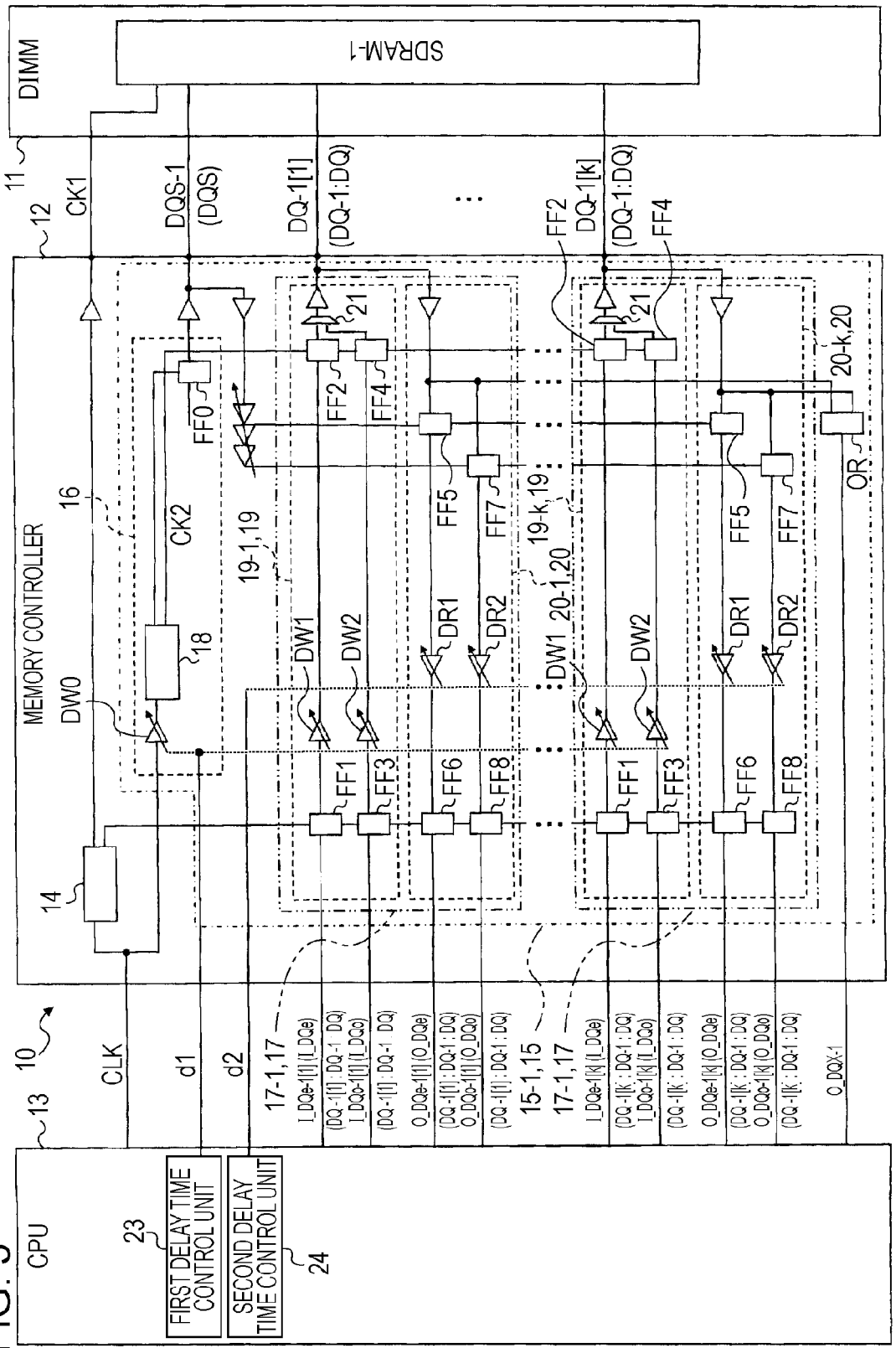
FIG. 5 is a block diagram showing a configuration example of a circuit of a memory controller, which corresponds to SDRAM-1, in the information processing apparatus according to the first embodiment.
Figure 6:
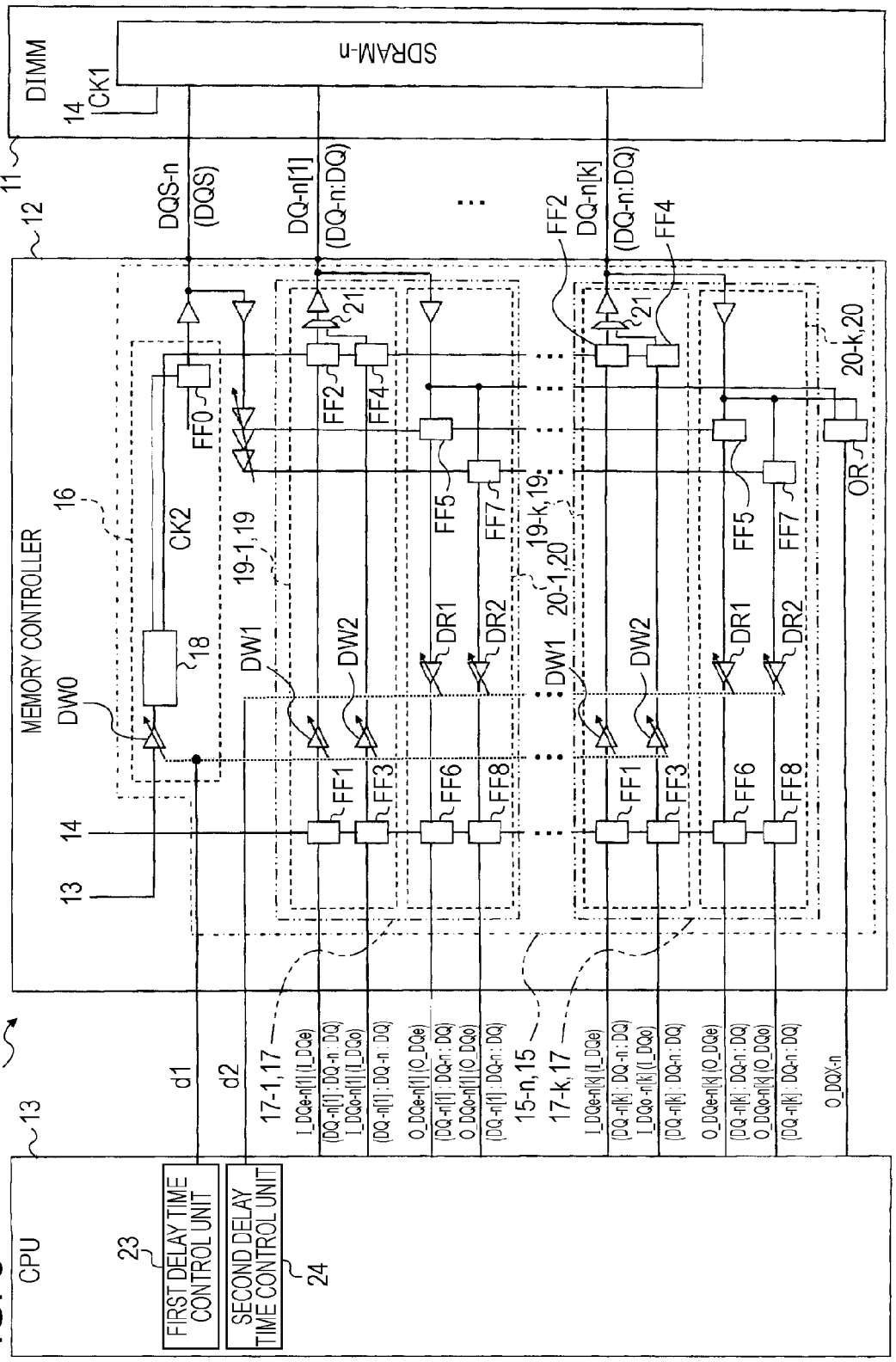
FIG. 6 is a block diagram showing a configuration example of a circuit of the memory controller, which corresponds to SDRAM-n, in the information processing apparatus according to the first embodiment.

FIG. 4 is a block diagram showing a configuration example of an information processing apparatus according to a first embodiment, FIG. 5 is a block diagram showing a configuration example of a circuit of a memory controller, which corresponds to SDRAM-1, in the information processing apparatus, and FIG. 6 is a block diagram showing a configuration example of a circuit of the memory controller, which corresponds to SDRAM-n, in the information processing apparatus.

As shown in FIG. 4, an information processing apparatus (delay time control device) 10 according to the first embodiment is constituted as a computer comprising a DIMM (Dual Inline Memory Module) 11, a memory controller (memory control circuit) 12, and a CPU (Central Processing Unit) 13.

The DIMM 11 is a memory module incorporating a plurality of memories therein. In the first embodiment, as shown in FIG. 4, the DIMM 11 includes a plurality (number n) of SDRAMs (Synchronous DRAMs (Dynamic Random Access Memories)), i.e., SDRAM-1 to SDRAM-n (n is a natural number of 2 or more). Also, "n" represents the number of channel (ch), but for the sake of simplicity, only the SDRAM-1 and SDRAM-n are illustrated in FIG. 4. It is to be noted that SDRAM itself is the known technique and a detailed description thereof is omitted here.

In the following description, regarding characters denoting the SDRAMs, when one among the plurality of SDRAMs needs to be specified, any of 1 to n is suffixed to SDRAM along with "-", while just SDRAM is used when an arbitrary SDRAM is to be indicated.

Further, in the first embodiment, fly-by topology is employed for wiring between the memory controller 12 and the plural SDRAMs of SDRAM-1 to SDRAM-n.

The term "fly-by topology" refers the daisy chain connection is used as part of the wiring between the memory controller 12 and the plural SDRAMs of SDRAM-1 to SDRAM-n.

In the first embodiment, therefore, a clock signal line for outputting (supplying) a clock signal CK1 generated by a first clock signal generator 14 (described later) is wired to the SDRAM-1 to the SDRAM-n through the daisy chain connection. Stated another way, as shown in FIG. 4, the clock signal line connected to the first clock signal generator 14 is connected to the SDRAM-1 to the SDRAM-n in series one after another. As with the clock signal line, other signal lines for outputting an address signal Add and a command signal CMD are also each connected to the SDRAM-1 to the SDRAM-n through the daisy chain connection.

Data signal line for interconnecting the memory controller 12 and the plural SDRAMs of SDRAM-1 to SDRAM-n are connected from the memory controller 12 respectively to the plural SDRAMs of SDRAM-1 to SDRAM-n in parallel. In the exemplary circuit diagram shown in FIG. 5, one DQS signal line (data signal line) for transmitting the data strobe signal DQS and a number k (k is a natural number of 2 or more) of DQ signal lines (data signal lines) for transmitting data signals DQ are connected from the memory controller 12 to each of the plural SDRAMs of SDRAM-1 to SDRAM-n in parallel. Further, those data signal lines are wired in lengths equal to one another (i.e. in the same length). In other words, the plurality of data signal lines connecting the memory controller 12 and the plural SDRAMs of SDRAM-1 to SDRAM-n have the same length.

The memory controller 12 is a DDR3 (Double Data Rate 3) memory interface for controlling read/write operations by supplying, through the clock signal line, the clock signal CK1 to the plural SDRAMs of SDRAM-1 to SDRAM-n to which the clock signal line is wired through the daisy chain connection. As shown in FIG. 4, by way of example, the memory controller 12 comprises the first clock signal generator 14 and a plurality of control circuit units 15-1 to 15-n.

In addition, the memory controller 12 has the write leveling function. Details of the write leveling function will be described later.

The plural control circuit units 15-1 to 15-n are constituted corresponding to the plural SDRAMs of SDRAM-1 to SDRAM-n, respectively. In other words, as shown in FIG. 4, the memory controller 12 includes, for example, the control circuit unit 15-1 corresponding to SDRAM-1 and the control circuit unit 15-n corresponding to SDRAM-n.

In the following description, regarding characters denoting the control circuit units, when one among the plurality of control circuit units needs to be specified, any of 1 to n is suffixed to a character 15 along with "-", while just the character 15 is used when an arbitrary control circuit unit is to be indicated.

Also, for the sake of simplicity, only the control circuit unit 15-1 and the control circuit unit 15-n are illustrated in the drawings.

Figure 9:
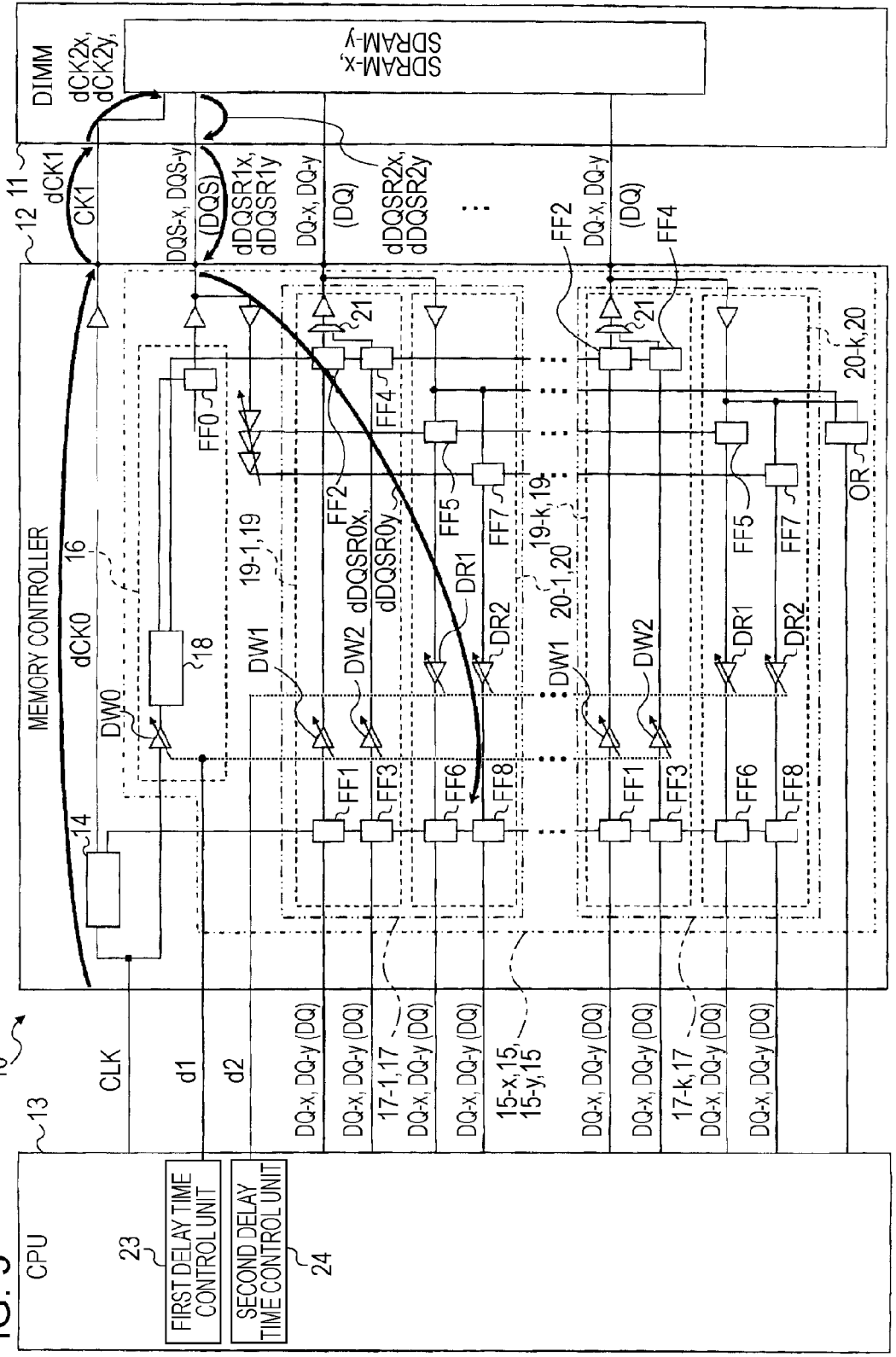
FIG. 9 is a block diagram for explaining the calculation formulae used to determine the first delay time in the first delay time control unit of the information processing apparatus according to the first embodiment.

The first clock signal generator 14 generates and outputs the clock signal CK1 having a predetermined cycle based on a clock signal CLK input from a CPU 13 (described later). As shown in FIGS. 5 and 9, for example, the first clock signal generator 14 outputs the clock signal CK1 to not only the DIMM 11 (SDRAM-1 to SDRAM-n), but also to the plural control circuit units 15-1 to 15-n through the clock signal lines. The first clock signal generator 14 may output, as the clock signal CK1, a clock signal having the same clock cycle as that of the clock signal CLK, or a clock signal produced by converting the clock signal CLK to have a different clock cycle, e.g., ½ or ¼ of the original clock cycle.

The control circuit unit 15 is to control input/output of the data strobe signal DQS and the data signals DQ. As shown in FIGS. 4 to 6, for example, the control circuit unit 15 comprises a DQS signal generator 16, a number k (k is a natural number of 2 or more) of DQ signal control units 17-1 to 17-k, and a logical sum circuit OR (see FIGS. 5 and 6).

In the following description, regarding characters denoting the DQ signal control units, when one among the DQ signal control units needs to be specified, any of 1 to k is suffixed to a character 17 along with "-", while just the character 17 is used when an arbitrary DQ signal control unit is to be indicated.

Also, for the sake of simplicity, only the DQ signal control unit 17-1 and the DQ signal control units 17-k are illustrated in the drawings.

The DQS signal generator 16 is to generate the data strobe signal DQS and is included in each control circuit unit 15 in a one-to-one relation. As shown in FIG. 5, for example, the control circuit unit 15-1 generates a data strobe signal DQS-1 and outputs it to SDRAM-1. Also, as shown in FIG. 6, the control circuit unit 15-n generates a data strobe signal DQS-n and outputs it to SDRAM-n.

In the following description, regarding characters denoting the data strobe signals, when one among the plurality of data strobe signals needs to be specified, any of characters DQS-1 to DQS-n is used, while just a character DQS is used when an arbitrary data strobe signal is to be indicated.

As shown in FIGS. 5 and 6, for example, the DQS signal generator 16 comprises a first variable delay circuit (first variable delay unit) DW0, a second clock signal generator 18, and a flip-flop FF0.

The first variable delay circuit DW0 is to delay the clock signal CLK, which is input from the CPU 13 (described later), in accordance with a first control signal d1 from a first delay time control unit 23 (described later), and to output the delayed clock signal. For example, the first variable delay circuit DW0 delays the clock signal CLK, which is input from the CPU 13 (described later), by a first delay time set by the first delay time control unit 23 (described later), and then outputs the delayed clock signal to the second clock signal generator 18.

In this embodiment, respective first delay times are set for the plurality of control circuit units 15-1 to 15-n. More specifically, a first delay time Dt1-1 is set for the first variable delay circuit DW0 of the control circuit unit 15-1. Likewise, a first delay time Dt1-n is set for the first variable delay circuit DW0 of the control circuit unit 15-n.

In the following description, regarding characters denoting the first delay times, when one among the plurality of first delay times needs to be specified, any of characters Dt1-1 to Dt1-n is used, while just a character Dt1 is used when an arbitrary first delay time is to be indicated.

The second clock signal generator 18 is to generate and output (supply) a clock signal CK2 based on the clock signal CLK input from the CPU 13 (described later). As shown in FIGS. 5 and 6, when the clock signal CLK is input, the second clock signal generator 18 outputs the clock signal CK2 having a predetermined cycle to the flip-flop FF0 and to flip-flops FF2 and FF4 (described later). The second clock signal generator 18 may output, as the clock signal CK2, a clock signal having the same clock cycle as that of the clock signal CLK, or a clock signal produced by converting the clock signal CLK to have a different clock cycle, e.g., ½ or ¼ of the original clock cycle.

The flip-flop FF0 is to generate and output the data strobe signal DQS in accordance with the clock signal CK2 input from the second clock signal generator 18. As shown in FIGS. 5 and 6, for example, when the clock signal CK2 is input, the flip-flop FF0 generates the data strobe signal DQS and outputs it to the SDRAM.

The DQ signal control unit 17 is to control input/output of the data signal DQ. As shown in FIGS. 5 and 6, for example, the DQ signal control unit 17 comprises a DQ signal input control unit 19 and a DQ signal output control unit 20. More specifically, as shown in FIGS. 5 and 6, in each of the plurality (number n) of control circuit units 15-1 to 15-n, the DQ signal control unit 17-1 comprises a DQ signal input control unit 19-1 and a DQ signal output control unit 20-1. Likewise, a DQ signal control unit 17-k comprises a DQ signal input control unit 19-k and a DQ signal output control unit 20-k.

In the following description, regarding characters denoting the DQ signal input control units, when one among the plurality (number k) of DQ signal input control units needs to be specified, any of characters 19-1 to 19-k is used, while just a character 19 is used when an arbitrary DQ signal input control unit is to be indicated. Also, regarding characters denoting the DQ signal output control units, when one among the plurality of DQ signal output control units needs to be specified, any of characters 20-1 to 20-k is used, while just a character 20 is used when an arbitrary DQ signal output control unit is to be indicated.

The DQ signal input control unit 19 executes control to output the data signal DQ, which is input from the CPU 13 (described later), to the SDRAM in the write operation. As shown in FIG. 5, for example, in the control circuit unit 15-1, the plurality (number k) of DQ signal input control units 19-1 to 19-k perform control such that, taking 19-1 as an example, a first data signal I_DQe-1[1] and a second data signal I_DQo-1[1] each input from the CPU 13 (described later) are output as a data signal DQ-1[1] to the SDRAM-1, and that, taking 19-k as an example, a first data signal I_DQe-1[k] and a second data signal I_DQo-1[k] each input from the CPU 13 (described later) are output as a data signal DQ-1[k] to the SDRAM-1.

Also, the DQ signal input control unit 19 executes control in the control circuit unit 15-n as follows. As shown in FIG. 6, for example, the plurality of DQ signal input control units 19-1 to 19-k perform control such that, taking 19-1 as an example, a first data signal I_DQe-n[1] and a second data signal I_DQo-n[1] each input from the CPU 13 (described later) are output as a data signal DQ-n[1] to the SDRAM-n, and that, taking 19-k as an example, a first data signal I_DQe-n[k] and a second data signal I_DQo-n[k] each input from the CPU 13 (described later) are output as a data signal DQ-n[k] to the SDRAM-n.

In the following description, regarding characters denoting the first data signals, when one among the plurality of first data signals needs to be specified, any of characters I_DQe-1[1] to I_DQe-1[k] and I_DQe-n[1] to I_DQe-n[k] is used, while just a character I_DQe is used when an arbitrary first data signal is to be indicated. Also, regarding characters denoting the second data signals, when one among the plurality of second data signals needs to be specified, any of characters I_DQo-1[1] to I_DQo-1[k] and I_DQo-n[1] to I_DQo-n[k] is used, while just a character I_DQo is used when an arbitrary second data signal is to be indicated.

Further, in the following description, when the first data signal or the second data signal needs to be specified in the case of indicating the data signal, any of the characters I_DQe, I_DQe-1[1] to I_DQe-1[k], and I_DQe-n[1] to I_DQe-n[k] denoting the first data signals or any of the characters I_DQo, I_DQo-1[1] to I_DQo-1[k], and I_DQo-n[1] to I_DQo-n[k] denoting the second data signals is used. However, when the first data signal and the second data signal are not required to be separately specified, any of characters DQ-1[1] to DQ-1[k] and DQ-n[1] to DQ-n[k] denoting respective data signals corresponding to the SDRAM-1 to the SDRAM-n is used. When an arbitrary data signal is to be indicated, just a character DQ is used. In addition, when the first data signal and the second data signal are not required to be specified, any of the characters DQ-1 to DQ-n are also used for the sake of simple expression instead of the characters DQ-1[1] to DQ-1[k] and DQ-n[1] to DQ-n[k] denoting the respective data signals corresponding to the SDRAM-1 to the SDRAM-n.

Stated another way, the first data signals I_DQe-1[1] to I_DQe-1[k] corresponding to the SDRAM-1 are also expressed, depending on cases, as the first data signal I_DQe, the data signals DQ-1[1] to DQ-1[k], the data signal DQ-1, and the data signal DQ. The first data signals I_DQe-n[1] to I_DQe-n[k] corresponding to the SDRAM-n are also expressed, depending on cases, as the first data signal I_DQe, the data signals DQ-n[1] to DQ-n[k], the data signal DQ-n, and the data signal DQ. Further, the second data signals I_DQo-1[1] to I_DQo-1[k] corresponding to the SDRAM-1 are also expressed, depending on cases, as the second data signal I_DQo, the data signals DQ-1[1] to DQ-1[k], the data signal DQ-1, and the data signal DQ. The second data signals I_DQo-n[1] to I_DQo-n[k] corresponding to the SDRAM-n are also expressed, depending on cases, as the second data signal I_DQo, the data signals DQ-n[1] to DQ-n[k], the data signal DQ-n, and the data signal DQ.

As shown in FIGS. 5 and 6, for example, the DQ signal input control unit 19 comprises a flip-flop FF1, one first variable delay circuit (first variable delay unit) DW1, a flip-flop FF2, a flip-flop FF3, another first variable delay circuit (first variable delay unit) DW2, and a flip-flop FF4.

The flip-flop FF1 outputs the first input data signal I_DQe, which is input from the CPU 13 (described later), to the first variable delay circuit DW1 when the clock signal CK1 generated from the first clock signal generator 14 is input.

The first variable delay circuit DW1 is a digital delay circuit for delaying the first input data signal I_DQe, which is input from the flip-flop FF1, in accordance with a first control signal d1 from the first delay time control unit 23 (described later), and for outputting the delayed first input data signal I_DQe to the flip-flop FF2. For example, the first variable delay circuit DW1 delays the first input data signal I_DQe, which is input from the flip-flop FF1, by a first delay time Dt1 set by the first delay time control unit 23 (described later) and then outputs the delayed first input data signal I_DQe to the flip-flop FF2.

The flip-flop FF2 outputs the first input data signal I_DQe, which is input from the first variable delay circuit DW1, to the SDRAM through a selector 21 when the clock signal CK2 generated from the second clock signal generator 18 is input.

The flip-flop FF3 outputs the second input data signal I_DQo, which is input from the CPU 13 (described later), to the first variable delay circuit DW2 when the clock signal CK1 generated from the first clock signal generator 14 is input.

The first variable delay circuit DW2 is a digital delay circuit for delaying the second input data signal I_DQo, which is input from the flip-flop FF3, in accordance with the first control signal d1 from the first delay time control unit 23 (described later), and for outputting the delayed second input data signal I_DQo to the flip-flop FF4. For example, the first variable delay circuit DW2 delays the second input data signal I_DQo, which is input from the flip-flop FF3, by the first delay time Dt1 set by the first delay time control unit 23 (described later) and then outputs the delayed second input data signal I_DQo to the flip-flop FF4.

In this embodiment, it is assumed that the same first delay time Dt1 is set for each of the plural SDRAMs of SDRAM-1 to SDRAM-n. More specifically, a first delay time Dt1-1 is set for the three first variable delay circuits DW0, DW1 and DW2 which are included in the control circuit unit 15-1 shown in FIG. 5. Likewise, a first delay time Dt1-n is set for the three first variable delay circuits DW0, DW1 and DW2 which are included in the control circuit unit 15-n shown in FIG. 6.

In the following description, regarding characters denoting the first variable delay circuits, when one among the plurality of first variable delay circuits needs to be specified, any of characters DW0, DW1 and DW2 is used, while just a character DW is used when an arbitrary first variable delay circuit is to be indicated.

Further, in the following description, a character DW-1 is also used to indicate the first variable delay circuit corresponding to the 1-channel SDRAM-1 for the sake of expressing the correlation. Likewise, a character DW-n is also used to indicate the first variable delay circuit corresponding to the n-channel SDRAM-n.

The flip-flop FF4 outputs the second input data signal I_DQo, which is input from the first variable delay circuit DW2, to the SDRAM through the selector 21 when the clock signal CK2 generated from the second clock signal generator 18 is input.

The DQ signal output control unit 20 executes control to output the data signal DQ, which is input from the SDRAM, to the CPU 13 (described later) in the read operation. As shown in FIG. 5, for example, in the control circuit unit 15-1, the plurality of DQ signal output control units 20-1 to 20-k perform control such that, taking 20-1 as an example, the data signal DQ-1[1] input from the SDRAM-1 is output as a third data signal O_DQe-1[1] and a fourth data signal O_DQo-1[1] to the CPU 13 (described later), and that, taking 20-k as an example, the data signal DQ-1[k] input from the SDRAM-1 is output as a third data signal O_DQe-1[k] and a fourth data signal O_DQo-1[k] to the CPU 13 (described later).

Also, the DQ signal output control unit 20 executes control in the control circuit unit 15-n as follows. As shown in FIG. 6, for example, the plurality of DQ signal output control units 20-1 to 20-k perform control such that, taking 20-1 as an example, the data signal DQ-n[1] input from the SDRAM-n is output as a third data signal O_DQe-n[1] and a fourth data signal O_DQo-n[1] to the CPU 13 (described later), and that, taking 20-k as an example, the data signal DQ-n[k] input from the SDRAM-n is output as a third data signal O_DQe-n[k] and a fourth data signal O_DQo-n[k] to the CPU 13 (described later).

In the following description, regarding characters denoting the third data signals, when one among the plurality of third data signals needs to be specified, any of characters O_DQe-1[1] to O_DQe-1[k] and O_DQe-n[1] to O_DQe-n[k] is used, while just a character O_DQe is used when an arbitrary third data signal is to be indicated. Also, regarding characters denoting the fourth data signals, when one among the plurality of fourth data signals needs to be specified, any of characters O_DQo-1[1] to O_DQo-1[k] and O_DQo-n[1] to O_DQo-n[k] is used, while just a character O_DQo is used when an arbitrary fourth data signal is to be indicated.

Further, in the following description, when the third data signal and the fourth data signal needs to be separately specified in the case of indicating the data signal, any of the characters O_DQe, O_DQe-1[1] to O_DQe-1[k], and O_DQe-n[1] to O_DQe-n[k] denoting the third data signals or any of the characters O_DQo, O_DQo-1[1] to O_DQo-1[k] and O_DQo-n[1] to O_DQo-n[k] denoting the fourth data signals is used. However, when the third data signal and the fourth data signal are not required to be separately specified, any of characters DQ-1[1] to DQ-1[k] and DQ-n[1] to DQ-n[k] denoting respective data signals corresponding to the SDRAM-1 to the SDRAM-n is used. When an arbitrary data signal is to be indicated, just a character DQ is used. In addition, when the third data signal and the fourth data signal are not required to be separately specified, any of the characters DQ-1 to DQ-n are also used for the sake of simple expression instead of the characters DQ-1[1] to DQ-1[k] and DQ-n[1] to DQ-n[k] denoting the respective data signals corresponding to the SDRAM-1 to the SDRAM-n.

Stated another way, the third data signals O_DQe-1[1] to O_DQe-1[k] corresponding to the SDRAM-1 are also expressed, depending on cases, as the third data signal O_DQe, the data signals DQ-1[1] to DQ-1[k], the data signal DQ-1, and the data signal DQ. The third data signals O_DQe-n[1] to O_DQe-n[k] corresponding to the SDRAM-n are also expressed, depending on cases, as the third data signal O_DQe, the data signals DQ-n[1] to DQ-n[k], the data signal DQ-n, and the data signal DQ. Further, the fourth data signals O_DQo-1[1] to O_DQo-1[k] corresponding to the SDRAM-1 are also expressed, depending on cases, as the fourth data signal O_DQo, the data signals DQ-1[1] to DQ-1[k], the data signal DQ-1, and the data signal DQ. The fourth data signals O_DQo-n[1] to O_DQo-n[k] corresponding to the SDRAM-n are also expressed, depending on cases, as the fourth data signal O_DQo, the data signals DQ-n[1] to DQ-n[k], the data signal DQ-n, and the data signal DQ.

As shown in FIGS. 5 and 6, for example, the DQ signal output control unit 20 comprises a flip-flop FF5, one second variable delay circuit (second variable delay unit) DR1, a flip-flop FF6, a flip-flop FF7, another second variable delay circuit (second variable delay unit) DR2, and a flip-flop FF8.

The flip-flop FF5 outputs the third data signal O_DQe, which is input from the SDRAM, to the second variable delay circuit DR1 when the data strobe signal DQS is input from the SDRAM.

The second variable delay circuit DR1 is a digital delay circuit for delaying the third data signal O_DQe, which is input from the flip-flop FF5, in accordance with a second control signal d2 from the second delay time control unit 24 (described later), and for outputting the delayed third data signal O_DQe to the flip-flop FF6. For example, the second variable delay circuit DR1 delays the third data signal O_DQe, which is input from the flip-flop FF5, by a second delay time set by the second delay time control unit 24 (described later) and then outputs the delayed third data signal O_DQe to the flip-flop FF6.

In this embodiment, respective second delay times are set for the plurality of control circuit units 15-1 to 15-$n$. More specifically, a second delay time Dt2-1 is set for the second variable delay circuit DR1 of the control circuit unit 15-1. Likewise, a second delay time Dt2-$n$ is set for the second variable delay circuit DR1 of the control circuit unit 15-$n$.

In the following description, regarding characters denoting the second delay times, when one among the plurality of second delay times needs to be specified, any of characters Dt2-1 to Dt2-$n$ is used, while just a character Dt2 is used when an arbitrary second delay time is to be indicated.

The flip-flop FF6 outputs the third data signal O_DQe, which is input from the second variable delay circuit DR1, to the CPU 13 (described later) when the clock signal CK1 generated from the first clock signal generator 14 is input.

The flip-flop FF7 outputs the fourth data signal O_DQo, which is input from the SDRAM, to the second variable delay circuit DR2 when the data strobe signal DQS is input from the SDRAM.

The second variable delay circuit DR2 is a digital delay circuit for delaying the fourth data signal O_DQo, which is input from the flip-flop FF7, in accordance with the second control signal d2 from the second delay time control unit 24 (described later), and for outputting the delayed fourth data signal O_DQo to the flip-flop FF8. For example, the second variable delay circuit DR2 delays the fourth data signal O_DQo, which is input from the flip-flop FF7, by the second delay time Dt2 set by the second delay time control unit 24 (described later) and then outputs the delayed fourth data signal O_DQo to the flip-flop FF8.

In this embodiment, it is assumed that the same second delay time Dt2 is set for each of the plural SDRAMs of SDRAM-1 to SDRAM-n.

More specifically, a second delay time Dt2-1 is set for the two second variable delay circuits DR1 and DR2 which are included in the control circuit unit 15-1 shown in FIG. 5. Likewise, a second delay time Dt2-$n$ is set for the two second variable delay circuits DR1 and DR2 which are included in the control circuit unit 15-$n$ shown in FIG. 6.

In the following description, regarding characters denoting the second variable delay circuits, when one among the plurality of second variable delay circuits needs to be specified, any of characters DR1 and DR2 is used, while just a character DR is used when an arbitrary second variable delay circuit is to be indicated.

Further, in the following description, a character DR-1 is also used to indicate the second variable delay circuit corresponding to the 1-channel SDRAM-1 for the sake of expressing the correlation. Likewise, a character DR-n is also used to indicate the second variable delay circuit corresponding to the n-channel SDRAM-n.

The flip-flop FF8 outputs the fourth input data signal O_DQo, which is input from the second variable delay circuit DR2, to the CPU 13 (described later) when the clock signal CK1 generated from the first clock signal generator 14 is input.

The logical sum circuit OR outputs a response signal to the CPU 13 (described later) in accordance with the third data signal O_DQe and the fourth data signal O_DQo when the write leveling function (described later) is employed.

More specifically, as shown in FIG. 5, for example, when the write leveling function (described later) is employed, the logical sum circuit OR included in the control circuit unit 15-1 operates such that a response signal O_DQX-1 is output to the CPU 13 (described later) when any of the plurality of third data signals O_DQe-1[1] to O_DQe-1[$k$] corresponding to the SDRAM-1 and the plurality of fourth data signals O_DQo-1[1] to O_DQo-1[$k$] corresponding to the SDRAM-1 is input.

Also, as shown in FIG. 6, for example, when the write leveling function (described later) is employed, the logical sum circuit OR included in the control circuit unit 15-$n$ operates such that a response signal O_DQX-n is output to the CPU 13 (described later) when any of the plurality of third data signals O_DQe-n[1] to O_DQe-n[$k$] corresponding to the SDRAM-n and the plurality of fourth data signals O_DQo-n[1] to O_DQo-n[$k$] corresponding to the SDRAM-n is input.

In the following description, regarding characters denoting the response signals, when one among the plurality of response signals needs to be specified, any of characters O_DQX-1 to O_DQX-n is used, while just a character O_DQX is used when an arbitrary response signal is to be indicated.

The CPU 13 executes various kinds of numerical calculations, information processing, equipment control, etc. in the information processing apparatus 10, and it functions as the delay time control unit 22 in this embodiment. Also, the CPU 13 includes a MAC (Media Access Control; not shown) and executes inputting/outputting of various signals (such as the data signals DQ, the clock signal CLK, and the response signal DQX) through the MAC.

The delay time control unit 22 outputs a control signal for setting respective delay times to the first variable delay circuit DW and the second variable delay circuit DR which are included in each of the control circuit units 15-1 to 15-$n$. As shown in FIG. 4, the delay time control unit 22 comprises the first delay time control unit 23 and the second delay time control unit 24.

The first delay time control unit 23 controls the first variable delay circuit DW, which is included in each of the control circuit units 15-1 to 15-$n$, to delay the data signal by the first delay time Dt1 based on the write leveling function, and it outputs the first control signal d1 for setting the first delay time Dt1. Also, in this embodiment, the first delay time control unit 23 sets, based on the write leveling function, the first delay times Dt1-1 to Dt1-$n$ for the data strobe signals DQS-1 to DQS-n, which are output respectively to the plural SDRAMs of SDRAM-1 to SDRAM-n in the write operation.

Herein, the write leveling function refers to a function of adjusting (compensating) the data strobe signals DQS-1 to DQS-n so that they are input respectively to the plural SDRAMs of SDRAM-1 to SDRAM-n substantially at the same times as the clock signal CK1. The write leveling function is realized by setting the first delay times Dt1-1 to Dt1-$n$ for the data strobe signals DQS-1 to DQS-n, which are output respectively to the plural SDRAMs of SDRAM-1 to SDRAM-n to which the clock signal line is wired through the daisy chain connection, corresponding to the data signals DQ-1 to DQ-n output from the SDRAM-1 to the SDRAM-n.

Figure 7:
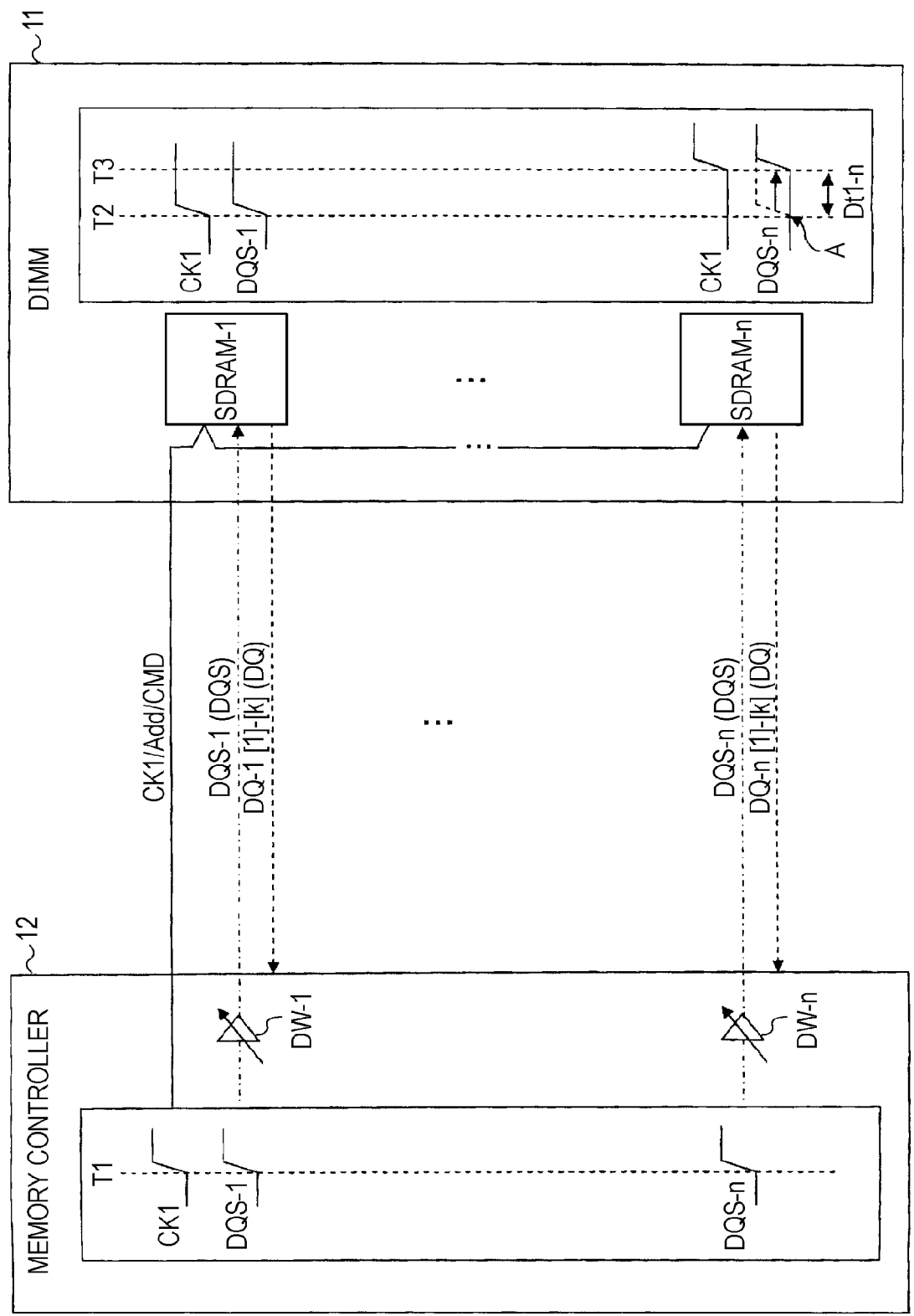
FIG. 7 is an explanatory diagram for explaining the write leveling function of a first delay time control unit in the information processing apparatus according to the first embodiment.

FIG. 7 is an explanatory diagram for explaining the write leveling function of the first delay time control unit in the information processing apparatus according to the first embodiment.

Regarding the case of setting the first delay times Dt1-1 to Dt1-n, which correspond respectively to the SDRAM-1 to the SDRAM-n, in the first delay time control unit 23 based on the write leveling function, the following description is made in connection with an example of setting the first delay time Dt1-1 corresponding to the 1-channel SDRAM-1 and the first delay time Dt1-n corresponding to the n-channel SDRAM-n, as shown in FIG. 7.

Also, each SDRAM (SDRAM-1 or SDRAM-n in the example shown in FIG. 7) outputs the data signal DQ (DQ-1[1] to -[k] and DQ-n[1] to -[k] in the example shown in FIG. 7) to the memory controller 12 when the clock signal CK1 and the data strobe signal DQS (DQS-1 or DQS-n in the example shown in FIG. 7) are input to each SDRAM substantially at the same time.

First, the memory controller 12 outputs the clock signal CK1 to each SDRAM (SDRAM-1 or SDRAM-n in the example shown in FIG. 7) and also outputs the data strobe signal DQS (DQS-1 or DQS-n in the example shown in FIG. 7) to each SDRAM (SDRAM-1 or SDRAM-n in the example shown in FIG. 7) at the same time or substantially at the same time as the clock signal CK1 (see a time "T1" in FIG. 7).

For example, before the first delay time Dt1 is adjusted based on the write leveling function, as shown in FIG. 7, the clock signal CK1 and the data strobe signal DQS-1 are input to the 1-channel SDRAM-1 substantially at the same time (see a time "T2" in FIG. 7), while the clock signal CK1 is input (see a time "T3" in FIG. 7) to the n-channel SDRAM-n with a delay of the time Dt1-n after the input of the data strobe signal DQS-n (see the time "T2" and a point "A" in FIG. 7).

In that case, for the 1-channel SDRAM-1, because the clock signal CK1 and the data strobe signal DQS-1 are input to the 1-channel SDRAM-1 substantially at the same time, the first delay time control unit 23 (not shown in FIG. 7) does not set the first delay time Dt1-1 for the data strobe signal DQS-1 corresponding to the first variable delay circuit DW-1 upon detecting that any of the data signals DQ-1[1] to -[k] from the 1-channel SDRAM-1 is input to the logical sum circuit OR-1 and the logical sum circuit OR-1 outputs the response signal O_DQX-1.

On the other hand, for the n-channel SDRAM-n, the first delay time Dt1-n corresponding to the data strobe signal DQS-n is set for the first variable delay circuit DW-n in match with the clock signal CK1 that is input (see the time "T3" in FIG. 7) to the n-channel SDRAM with a delay of the time Dt1-n after the input (see the time "T2" in FIG. 7) of the clock signal CK1 to the 1-channel SDRAM-1.

More specifically, for the n-channel SDRAM-n, the first delay time control unit 23 (not shown in FIG. 7) gradually prolongs the delay time for the first variable delay circuit DW-n until the clock signal CK1 and the data strobe signal DQS-n are input to the n-channel SDRAM-n substantially at the same time. Then, the first delay time control unit 23 detects a time at which any of the data signals DQ-n[1] to -[k] from the SDRAM-n is input to the logical sum circuit OR-n and the logical sum circuit OR-n outputs the response signal O_DQX-n, and sets the detected time, as the first delay time Dt1-n, for the first variable delay circuit DW-n.

Thus, the first delay time control unit 23 adjusts the timings of the input of the clock signal CK1 and the data strobe signal DQS to each of the SDRAM-1 to the SDRAM-n by setting the first delay time Dt1-n for the first variable delay circuit DW-n.

Figure 8:
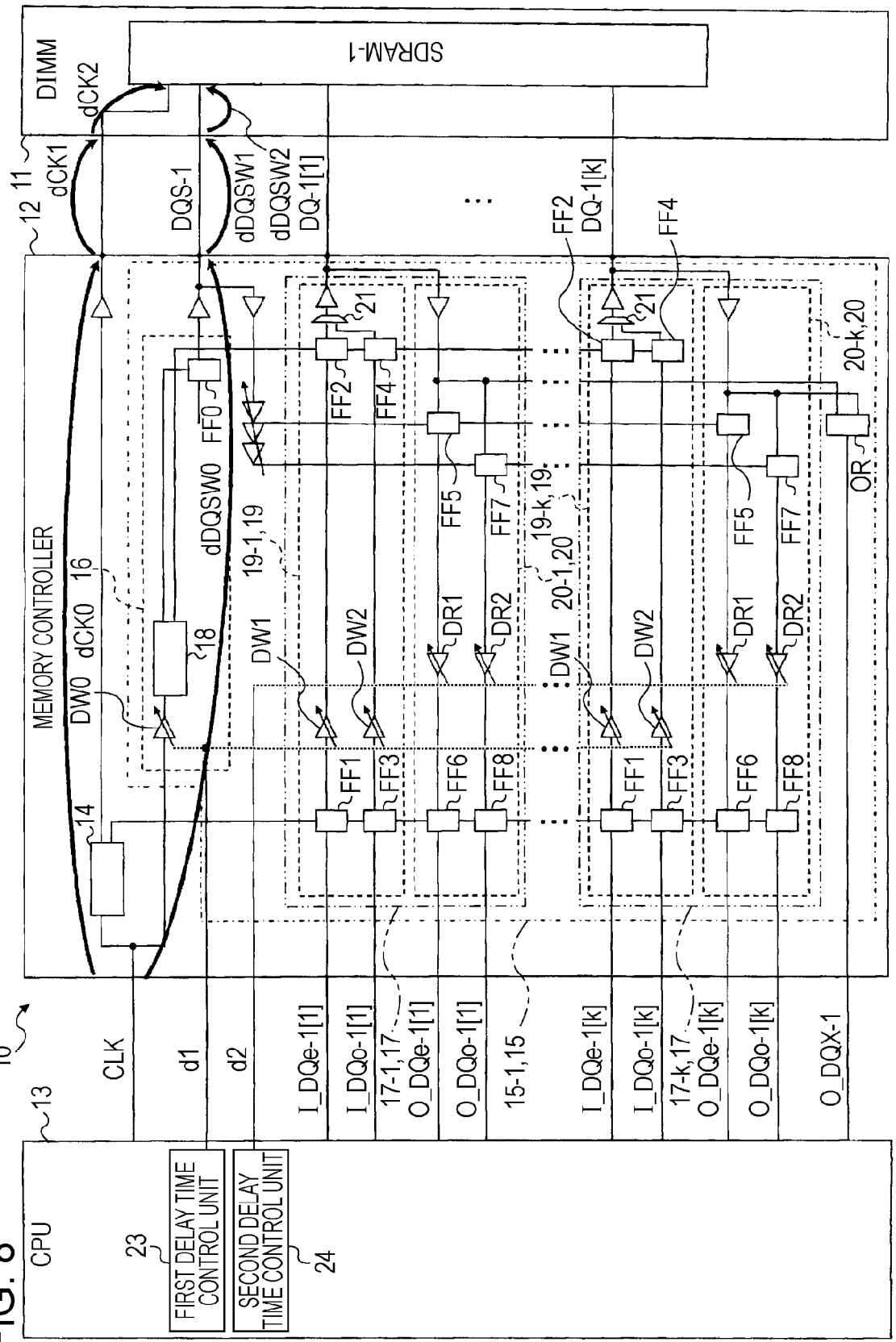
FIG. 8 is a block diagram for explaining calculation formulae used to determine a first delay time in the first delay time control unit of the information processing apparatus according to the first embodiment.

FIGS. 8 and 9 are each a block diagram for explaining calculation formulae used to determine the first delay time in the first delay time control unit of the information processing apparatus according to the first embodiment.

At the time when the adjustment of the first delay times Dt1-1 to Dt1-n is completed, the following formula (1) holds:

$$dCK0+dCK1+dCK2=dDQSW0+dDQSW1+dDQSW2 \quad (1)$$

As shown in FIG. 8, dCK0 represents a time from the input of the clock signal CLK to the memory controller 12 to the output of the clock signal CK1 from the memory controller 12, and dCK1 represents a time from the output of the clock signal CK1 from the memory controller 12 to the input thereof to the DIMM 11. Also, dCK2 represents a time from the input of the clock signal CK1 to the DIMM 11 to the input thereof to each of the SDRAM-1 to the SDRAM-n. In FIG. 8, dCK2 represents the time from the input of the clock signal CK1 to the DIMM 11 to the input thereof to the SDRAM-1.

Further, dDQSW0 represents a time from the input of the clock signal CLK to the memory controller 12 to the output of each of the data strobe signals DQS-1 to DQS-n from the memory controller 12. In FIG. 8, dDQSW0 represents the time from the input of the clock signal CLK to the memory controller 12 to the output of the data strobe signal DQS-1 from the memory controller 12.

Also, dDQSW1 represents a time from the output of each of the data strobe signals DQS-1 to DQS-n from the memory controller 12 to the input thereof to the DIMM 11. In FIG. 8, dDQSW1 represents the time from the output of the data strobe signal DQS-1 from the memory controller 12 to the input thereof to the DIMM 11.

In addition, dDQSW2 represents a time from the input of each of the data strobe signals DQS-1 to DQS-n to the DIMM 11 to the input thereof to corresponding one of the SDRAM-1 to the SDRAM-n. In FIG. 8, dDQSW2 represents the time from the input of the data strobe signal DQS-1 to the DIMM 11 to the input thereof to the SDRAM-1.

Because the wirings for connection between the memory controller 12 and the DIMM 11 are formed in the same length, dCK1=dDQSW1 holds in the formula (1) and hence the formula (1) can be modified to the following formulae (2-1) and (2-2):

$$dCK0+dCK2=dDQSW0+dDQSW2 \quad (2\text{-}1)$$

$$dCK2=dDQSW0-dCK0+dDQSW2 \quad (2\text{-}2)$$

Assuming (dDQSW0−dCK0) to be a delay time Delay (W)n at the write operation in the n-channel SDRAM-n, the formula (2-2) can be rewritten into the following formula (2-3):

$$dCK2=\text{Delay}(W)n+dDQSW2 \quad (2\text{-}3)$$

Thus, the first delay times Dt1-1 to Dt1-n corresponding respectively to the SDRAM-1 to the SDRAM-n are set so as to become longer gradually in the order from the 1-channel SDRAM-1 toward the n-channel SDRAM-n.

Further, the first delay time control unit 23 outputs the respective first control signals d1 to the first variable delay circuits DW-1 to DW-n so that the set first delay times Dt1-1 to Dt1-n are obtained. In accordance with the first control signals d1, the first variable delay circuits DW-1 to DW-n delay the data strobe signals DQS-1 to DQS-n by the first delay times Dt1-1 to Dt1-n, respectively.

As described above, during the write operation, the first variable delay circuit DW delays the data strobe signal DQS output to the SDRAM by the first delay time Dt1 that has been set based on the write leveling function.

The second delay time control unit 24 controls the second variable delay circuit DR, which is included in each of the control circuit units 15-1 to 15-$n$, to delay the data signal by the second delay time Dt2 in accordance with corresponding one of the first delay times Dt1-1 to Dt1-$n$ set by the first delay time control unit 23, and it outputs the second control signal d2 for setting the second delay time Dt2. Further, in this embodiment, based on the first delay times Dt1-1 to Dt1-$n$ set by the first delay time control unit 23, the second delay time control unit 24 calculates and sets the respective second delay times Dt2 for the data signals DQ-1 to DQ-n that are input respectively from the plural SDRAMs of SDRAM-1 to SDRAM-n in the read operation.

More specifically, the second delay time control unit 24 sets respective delay times Delay(R) for the data signals DQ-1 to DQ-n that are input respectively from the SDRAM-1 to the SDRAM-n. As shown in FIG. 9, for example, for an x-channel (x is a natural number) SDRAM-x and a y-channel (y is a natural number) SDRAM-y, the following formulae (3-1) and (3-2) hold regarding respective lapsed times Pass(R)x and Pass(R)y from the input of the clock signal CLK to the memory controller 12 to the output of the data signals DQ-x and DQ-y to the CPU 13 from the memory controller 12:

$$\text{Pass}(R)x = dCK0 + dCK1 + dCK2x + dDQSR2x + dDQSR1x + dDQSR0x \quad (3\text{-}1)$$

$$\text{Pass}(R)y = dCK0 + dCK1 + dCK2y + dDQSR2y + dDQSR1y + dDQSR0y \quad (3\text{-}2)$$

As shown in FIG. 9, similarly to the case of FIG. 8, dCK0 represents a time from the input of the clock signal CLK to the memory controller 12 to the output of the clock signal CK1 from the memory controller 12, and dCK1 represents a time from the output of the clock signal CK1 from the memory controller 12 to the input thereof to the DIMM 11. In addition, dCK2x represents a time from the input of the clock signal CK1 to the DIMM 11 to the input thereof to the x-channel SDRAM-x, and dDQSR2x represents a time from the output of an x-channel data strobe signal DQS-x from the x-channel SDRAM-x to the output thereof from the DIMM 11. Further, dDQSR1x represents a time from the output of the x-channel data strobe signal DQS-x from the DIMM 11 to the input thereof to the memory controller 12, and dDQSR0x represents a time from the input of the x-channel data strobe signal DQS-x to the memory controller 12 to the input of the data signal DQ-x to the flip-flop FF6 or the flip-flop FF8.

Moreover, as shown in FIG. 9, dCK2y represents a time from the input of the clock signal CK1 to the DIMM 11 to the input thereof to the y-channel SDRAM-y, and dDQSR2y represents a time from the output of a y-channel data strobe signal DQS-y from the y-channel SDRAM-y to the output thereof from the DIMM 11. Further, dDQSR1y represents a time from the output of the y-channel data strobe signal DQS-y from the DIMM 11 to the input thereof to the memory controller 12, and dDQSR0y represents a time from the input of the y-channel data strobe signal DQS-y to the memory controller 12 to the input of the data signal DQ-y to the flip-flop FF6 or the flip-flop FF8.

Herein, in order to make the lapsed time Pass(R)x in the x-channel and the lapsed time Pass(R)y in the y-channel equal to each other, the following formula (3-3) has to be satisfied:

$$dCK0 + dCK1 + dCK2x + dDQSR2x + dDQSR1x + dDQSR0x = dCK0 + dCK1 + dCK2y + dDQSR2y + dDQSR1y + dDQSR0y \quad (3\text{-}3)$$

Because the wirings for connection between the memory controller 12 and the DIMM 11 are formed in the same length, dDQSR2x=dDQSR2y and dDQSR1x=dDQSR1y hold in the formula (3-3) and hence the formula (3-3) can be modified to the following formula (3-4):

$$dCK2x + dDQSR0x = dCK2y + dDQSR0y \quad (3\text{-}4)$$

Assuming herein dDQSR0x=Delay(R)x+α and dDQSW2x=dDQSW2y and substituting those relations in the above-mentioned formula (2-3), the following formula (3-5) is obtained:

$$\text{Delay}(W)x + \text{Delay}(R)x = \text{Delay}(W)y + \text{Delay}(R)y \quad (3\text{-}5)$$

The formula (3-5) can be generalized into the following formula (3-6):

$$\text{Delay}(R)n = \max(\text{Delay}(W)) - \text{Delay}(W)n \quad (3\text{-}6)$$

The delay time thus calculated is provided as Delay(R)n. In other words, the second delay time Dt2 for the data signal DQ input from the SDRAM can be calculated by using the first delay time Dt1 that has been set in the write leveling.

Accordingly, in the second delay time control unit 24, the second delay time Dt2-$x$ corresponding to one SDRAM-x is set by using the above-mentioned formula (3-5) so that the sum of the first delay time Dt1-$x$ and the second delay time Dt2-$x$ both corresponding to the relevant SDRAM-x is equal to a preset value.

Also, in the second delay time control unit 24, the second delay time Dt2-$x$ corresponding to one SDRAM-x is set by using the above-mentioned formula (3-5) so that the sum of the first delay time Dt1-$x$ and the second delay time Dt2-$x$ both corresponding to the relevant SDRAM-x is equal to the sum of the first delay time Dt1-$y$ and the second delay time Dt2-$y$ both corresponding to another SDRAM-y.

Further, in the second delay time control unit 24, the second delay time Dt2-$x$ corresponding to one SDRAM-x is set by using the above-mentioned formula (3-6) to be the difference between the first delay time Dt1-$x$ corresponding to the relevant SDRAM-x and a maximum delay time Dt1-$n$ among the plurality of first delay times Dt1-1 to Dt1-$n$ corresponding respectively to the SDRAM-1 to the SDRAM-n.

Thus, the second delay times Dt2-1 to Dt2-$n$ corresponding respectively to the SDRAM-1 to the SDRAM-n are set so as to become shorter gradually in the order from the 1-channel SDRAM-1 toward the n-channel SDRAM-n.

Further, the second delay time control unit 24 outputs the respective second control signals d2 to the second variable delay circuits DR-1 to DR-n so that the set second delay times Dt2-1 to Dt2-$n$ are obtained. In accordance with the second control signals d2, the second variable delay circuits DR-1 to DR-n delay the data signals DQ-1 to DQ-n by the second delay times Dt2-1 to Dt2-$n$, respectively.

In other words, during the read operation, the second variable delay circuit DR delays the data signal DQ input from the SDRAM by the second delay time Dt2 that has been set based on the first delay time Dt1.

An example of the write operation executed using the first variable delay circuit DW in the above-described information processing apparatus 10 according to the first embodiment will be described below with reference to FIG. 10.

For the sake of convenience, the following description is made in connection with the case where the write operation is executed on the 1-channel SDRAM-1 and the n-channel SDRAM-n.

Also, for the sake of convenience, in the following description, the flip-flops FF2 and FF4 corresponding to the 1-channel SDRAM-1 are each denoted by FF-1a, and the flip-flops FF2 and FF4 corresponding to the n-channel SDRAM-n are each denoted by FF-na.

The first delay time control unit 23 sets the first delay times Dt1-1 to Dt1-n, which correspond respectively to the SDRAM-1 to the SDRAM-n, based on the write leveling function, and then outputs the respective first control signals d1, which correspond to the set first delay times Dt1-1 to Dt1-n, to the corresponding first variable delay circuits DW-1 to DW-n (first delay time control step).

After the first delay times Dt1-1 to Dt1-n have been set respectively in the first variable delay circuits DW-1 to DW-n, the write operation is executed as follows.

Figure 10:
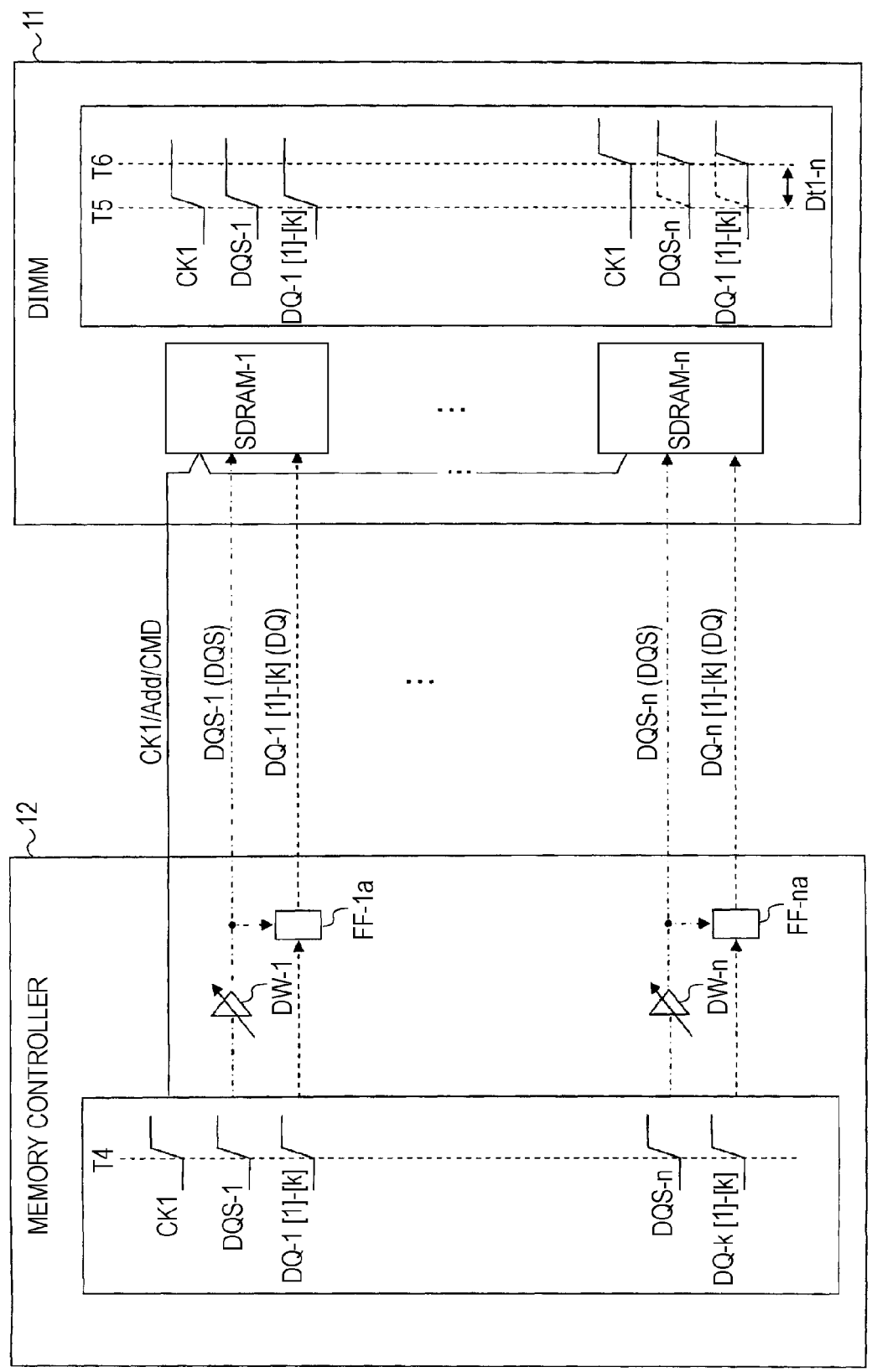
FIG. 10 is an explanatory diagram for explaining a write operation using a first variable delay circuit in the information processing apparatus according to the first embodiment.

The memory controller 12 outputs the clock signal CK1 to each SDRAM (SDRAM-1 and SDRAM-n in the example of FIG. 10), and it also generates each data strobe signal (DQS-1 and DQS-n in the example of FIG. 10) substantially at the same time as the output of the clock signal CK1 and then outputs the generated data strobe signal to each first variable delay circuit (DW-1 and DW-n in the example of FIG. 10) (see a time "T4" in FIG. 10).

In the case shown in FIG. 10, the first variable delay circuit DW-1 outputs the input data strobe signal DQS-1 to the SDRAM-1 and the flip-flop FF-1a without delaying it, while the first variable delay circuit DW-n outputs the input data strobe signal DQS-n to the SDRAM-n and the flip-flop FF-na after delaying it by the delay time Dt1-n.

Further, the memory controller 12 outputs the data signals DQ-1[1] to -[k], which correspond to the SDRAM-1, to the flip-flop FF-1a through respective first variable delay circuits (not shown, each of which has the same construction as the first variable delay circuit DW-1) substantially at the same time as the data strobe signal DQS-1, and also outputs the data signals DQ-n[1] to -[k], which correspond to the SDRAM-n, to the flip-flop FF-na through respective first variable delay circuits (not shown, each of which has the same construction as the first variable delay circuit DW-n) substantially at the same time as the data strobe signal DQS-n.

When the data strobe signal DQS-1 is input, the flip-flop FF-1a outputs the data signals DQ-1[1] to [k] to the SDRAM-1. Similarly, when the data strobe signal DQS-n is input, the flip-flop FF-na outputs the data signals DQ-n[1] to [k] to the SDRAM-n.

The data strobe signal DQS-1 and the data signals DQ-1[1] to [k] are input to the SDRAM-1 substantially at the same time as the clock signal CK1 (see a time "T5" in FIG. 10). The data strobe signal DQS-n and the data signals DQ-n[1] to [k] are input (see a time "T6" in FIG. 10) to the SDRAM-n substantially at the same time as the clock signal CK1 which has been delayed by the first delay time Dt1-n after the input of the clock signal CK1 to the SDRAM-1 (see the time "T5" in FIG. 10).

As a result, the data strobe signal DQS and the data signals DQ are input to each of the SDRAM-1 to the SDRAM-n substantially at the same time as the clock signal CK1, whereby the write operation is executed.

An example of the read operation executed using the second variable delay circuit DR in the above-described information processing apparatus 10 according to the first embodiment will be described below with reference to FIG. 11.

For the sake of convenience, the following description is made in connection with the case where the read operation is executed on the 1-channel SDRAM-1 and the n-channel SDRAM-n.

Also, for the sake of convenience, in the following description, the flip-flops FF5 and FF7 corresponding to the 1-channel SDRAM-1 are each denoted by FF-1b, and the flip-flops FF5 and FF7 corresponding to the n-channel SDRAM-n are each denoted by FF-nb.

The second delay time control unit 24 sets the second delay times Dt2-1 to Dt2-n, which correspond respectively to the SDRAM-1 to the SDRAM-n, based on the first delay times Dt1-1 to Dt1-n corresponding respectively to the SDRAM-1 to the SDRAM-n, and then outputs the respective second control signals d2, which correspond to the set second delay times Dt2-1 to Dt2-n, to the corresponding second variable delay circuits DR-1 to DR-n (second delay time control step).

After the second delay times Dt2-1 to Dt2-n have been set respectively in the second variable delay circuits DR-1 to Dr-n, the read operation is executed as follows.

Figure 11:
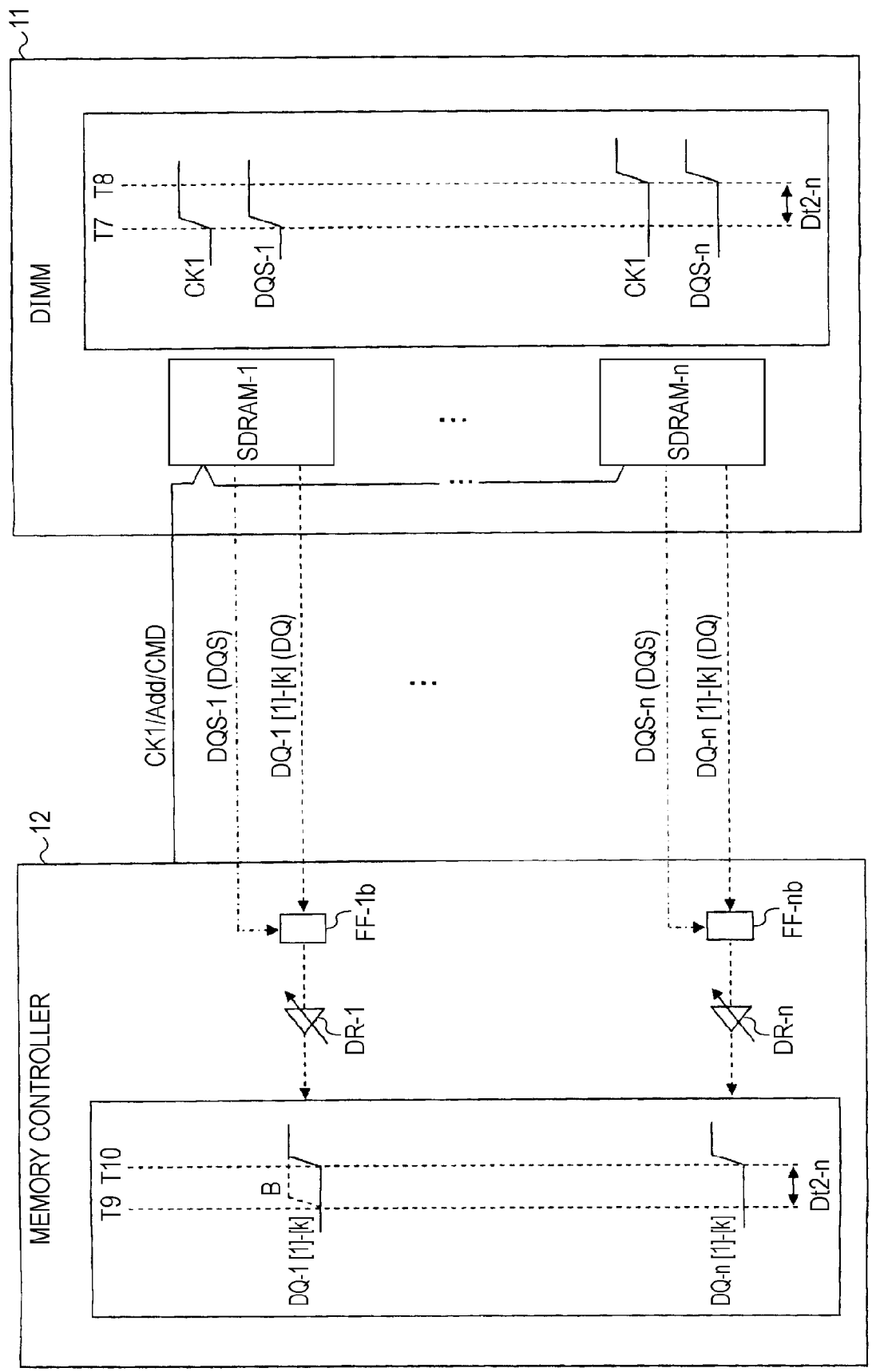
FIG. 11 is an explanatory diagram for explaining a read operation using a second variable delay circuit in the information processing apparatus according to the first embodiment.

The memory controller 12 outputs the clock signal CK1 to each SDRAM (SDRAM-1 and SDRAM-n in the example of FIG. 11) (see a time "T7" in FIG. 11). In this embodiment, since the clock signal line is wired to the SDRAM-1 to the SDRAM-n through the daisy chain connection, the clock signal CK1 is successively input to the SDRAM-1 to the SDRAM-n one after another.

Therefore, the clock signal CK1 is input to the SDRAM-n with a delay of the second delay time Dt2-n after the input of the clock signal CK1 to the SDRAM-1 (see a time "T8" in FIG. 11).

In the case shown in FIG. 11, when the clock signal CK1 is input, the SDRAM-1 outputs the data strobe signal DQS-1 and the data signals DQ-1[1] to -[k] to the flip-flop FF-1b in the memory controller 12 (see the time "T7" in FIG. 11). Similarly, when the clock signal CK1 is input with the delay of the second delay time Dt2-n after the input of the clock signal CK1 to the SDRAM-1, the SDRAM-n outputs the data strobe signal DQS-n and the data signals DQ-n[1] to -[k] to the flip-flop FF-nb in the memory controller 12 (see the time "T8" in FIG. 11).

When the data strobe signal DQS-1 is input, the flip-flop FF-1b outputs the data signals DQ-1[1] to -[k] to the second variable delay circuit DR-1. Similarly, when the data strobe signal DQS-n is input, the flip-flop FF-nb outputs the data signals DQ-n[1] to -[k] to the second variable delay circuit DR-n.

The second variable delay circuit DR-n outputs the input the data signals DQ-n[1] to -[k] to the CPU 13 (not shown in FIG. 11) without delaying them, while the second variable delay circuit DR-1 outputs the input the data signals DQ-1[1] to -[k] to the CPU 13 after delaying them by the second delay time Dt2-n (see a time "T9", a time "T10" and a dotted line "B" in FIG. 11).

As a result, the respective data signals DQ corresponding to the SDRAM-1 to the SDRAM-n are input to the CPU 13 substantially at the same time, whereby the read operation is executed.

Thus, with the information processing apparatus 10 according to the first embodiment, for the plurality of SDRAMS of SDRAM-1 to SDRAM-n to which the clock signal line is wired through the daisy chain connection, the input times of the respective data signals DQ output from the SDRAM-1 to the SDRAM-n, to which the clock signal line is wired through the daisy chain connection, can be easily matched with one another by setting, based on the first delay time Dt1 set by utilizing the write leveling function, the second delay time Dt2 for each data signal DQ input from the SDRAM in the read operation. Accordingly, a failure due to a delay in propagation of the data signal DQ can be prevented in control of the read operation.

Also, with the provision of the second variable delay circuit DR for delaying the data signal by the second delay time Dt2 based on the first delay time Dt1 that has been set by utilizing the write leveling function, a memory interface capable of matching the input times of the respective data signals DQ output from the SDRAM-1 to the SDRAM-n with one another, to which the clock signal line is wired through the daisy chain connection, can be simply realized without providing a special mechanism, such as an FIFO.

Further, since the plural data signal lines connecting the memory controller 12 and the DIMM 11 to each other are formed in the same length, the formula for calculating the second delay time Dt2 is simplified and the second delay time Dt2 for the data signal DQ input from the SDRAM during the read operation can be easily obtained.

Moreover, since the sum of the first delay time Dt1 and the second delay time Dt2 both corresponding to one SDRAM is set equal to the preset value and the sum of the first delay time Dt1 and the second delay time Dt2 both corresponding to one SDRAM is set equal to the sum of the first delay time Dt1 and the second delay time Dt2 both corresponding to another SDRAM, criteria for setting the second delay time Dt2 can be clarified based on the first delay time Dt1 that has been set by utilizing the write leveling function, and the respective second delay times Dt2 for the plurality of SDRAMs can be easily determined.

In addition, since the second delay time Dt2 corresponding to one SDRAM is set to be the difference between the first delay time Dt1 corresponding to the relevant SDRAM and a maximum delay time Dt1-*n* among the plurality of first delay times Dt1-1 to Dt1-*n* corresponding respectively to the SDRAM-1 to the SDRAM-n, the formula for calculating the second delay time Dt2 is generalized and the respective second delay times Dt2 for the SDRAM-1 to the SDRAM-n can be more easily obtained.

[2] Modification of First Embodiment

A modification of the information processing apparatus 10 according to the first embodiment will be described below with reference to FIGS. 12 and 13.

Figure 12:
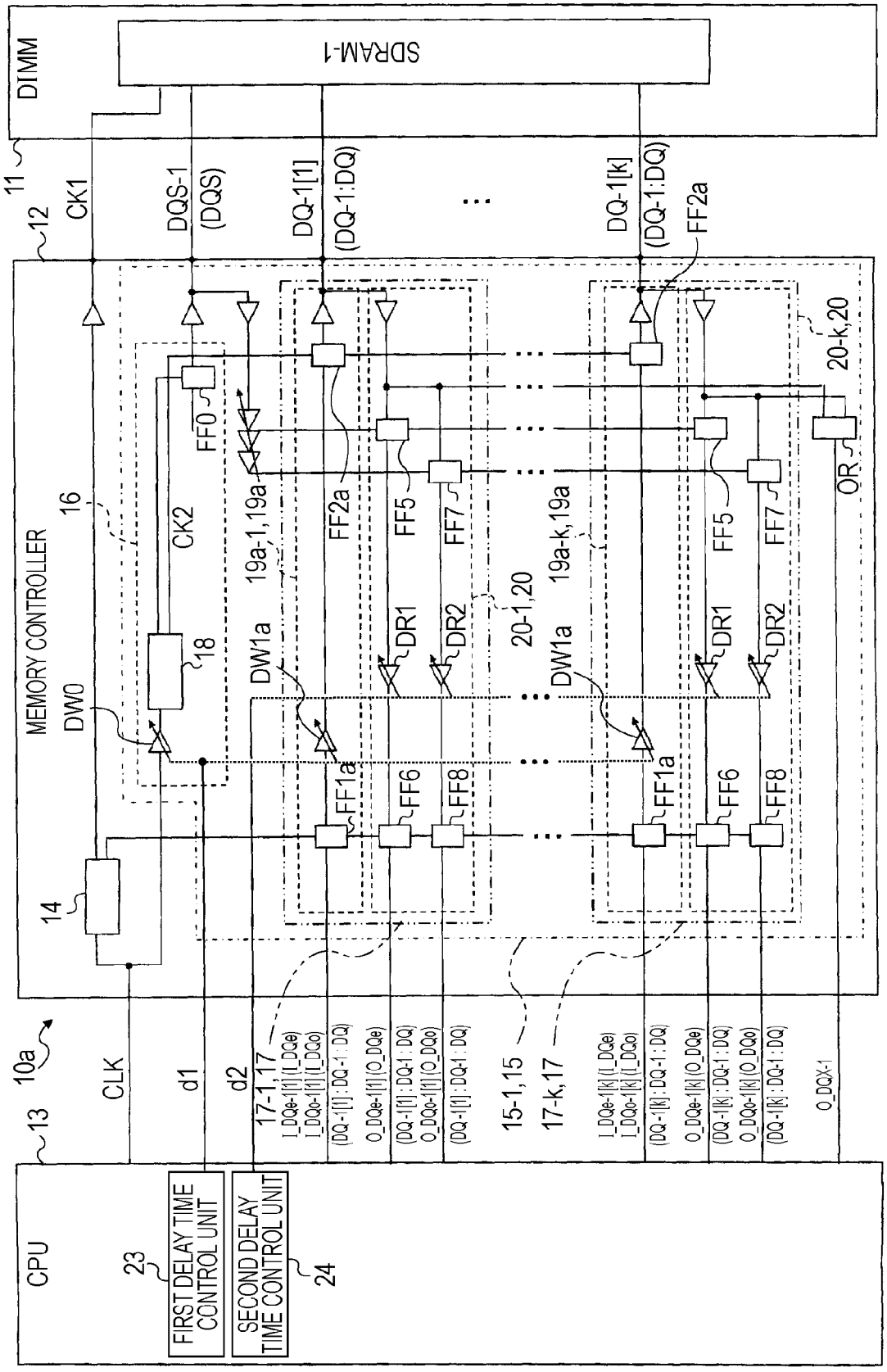
FIG. 12 is a circuit diagram showing a portion of the memory controller, which corresponds to the SDRAM-1, in the information processing apparatus according to a modification of the first embodiment.
Figure 13:
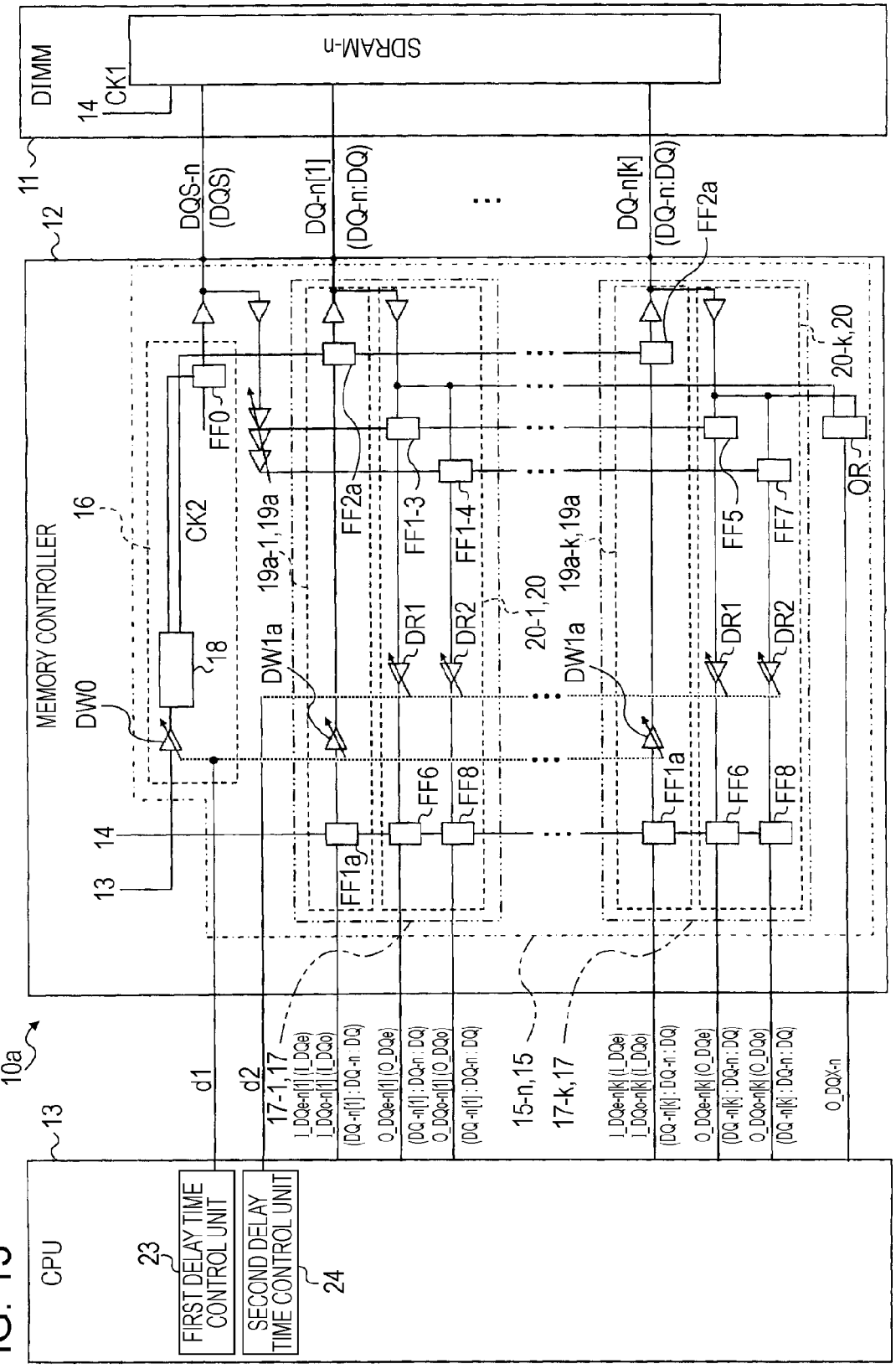
FIG. 13 is a circuit diagram showing a portion of the memory controller, which corresponds to the SDRAM-n, in the information processing apparatus according to the modification of the first embodiment.

FIG. 12 is a circuit diagram showing a portion of the memory controller, which corresponds to the SDRAM-1, in the information processing apparatus according to a modification of the first embodiment, and FIG. 13 is a circuit diagram showing a portion of the memory controller, which corresponds to the SDRAM-n, in the information processing apparatus according to the modification.

As shown in FIGS. 12 and 13, an information processing apparatus 10*a* according to the modification of the first embodiment includes DQ signal input control units 19*a*-1 to 19*a*-*k* instead of the DQ signal input control units 19-1 to 19-*k* in each of the control circuit units 15-1 to 15-*n* in the first embodiment. The remaining part of the information processing apparatus 10*a* is constructed similarly to that of the information processing apparatus 10 according to the first embodiment.

Note that because the same characters in FIGS. 12 and 13 as the above-mentioned characters denote the same or essentially the same components, a detailed description thereof is omitted here.

In the following description, regarding characters denoting the DQ signal input control units in the modification of the first embodiment, when one among the plurality of DQ signal input control units needs to be specified, any of characters 19*a*-1 to 19*a*-*k* is used, while just a character 19*a* is used when an arbitrary DQ signal input control unit is to be indicated.

As with the above-described DQ signal input control units 19 in the first embodiment, the DQ signal input control unit 19*a* in the modification of the first embodiment executes control to output the first data signal I_DQe and the second data signal I_DQo, which are input from the CPU 13, to the SDRAM in the write operation. Unlike the above-described DQ signal input control unit 19 in the first embodiment, however, the DQ signal input control unit 19*a* executes the control such that the first data signal I_DQe and the second data signal I_DQo are output to the SDRAM in a multiplied state.

Note that because a method for outputting the first data signal I_DQe and the second data signal I_DQo to the SDRAM in a multiplied state is a known technique, a detailed description of the method is omitted here.

As shown in FIGS. 12 and 13, for example, the DQ signal input control unit 19*a* in the modification of the first embodiment comprises a flip-flop FF1*a*, a first variable delay circuit (first variable delay unit) DW1*a*, and a flip-flop FF2*a*.

The flip-flop FF1*a* outputs the first data signal I_DQe or the second data signal I_DQo, which is input from the CPU 13, to the first variable delay circuit DW1*a* when the clock signal CK1 generated from the first clock signal generator 14 is input.

The first variable delay circuit DW1*a* is a digital delay circuit for delaying the first data signal I_DQe or the second data signal I_DQo, which is input from the flip-flop FF1*a*, in accordance with the first control signal d1 from the first delay time control unit 23, and for outputting the delayed first or second data signal to the flip-flop FF2*a*. For example, the first variable delay circuit DW1*a* delays the first data signal I_DQe or the second data signal I_DQo, which is input from the flip-flop FF1*a*, by the first delay time Dt1-1 set by the first delay time control unit 23 and then outputs the delayed first or second data signal to the flip-flop FF2*a*.

The flip-flop FF2*a* outputs the first data signal I_DQe or the second data signal I_DQo, which is input from the first variable delay circuit DW1*a*, to the SDRAM when the clock signal CK2 generated from the second clock signal generator 18 is input.

Thus, the information processing apparatus 10*a* according to the modification of the first embodiment can also provide similar working advantages to those in the first embodiment.

[3] Second Embodiment

An information processing apparatus 10*b* according to a second embodiment will be described with reference to FIGS. 14 and 15.

Figure 14:
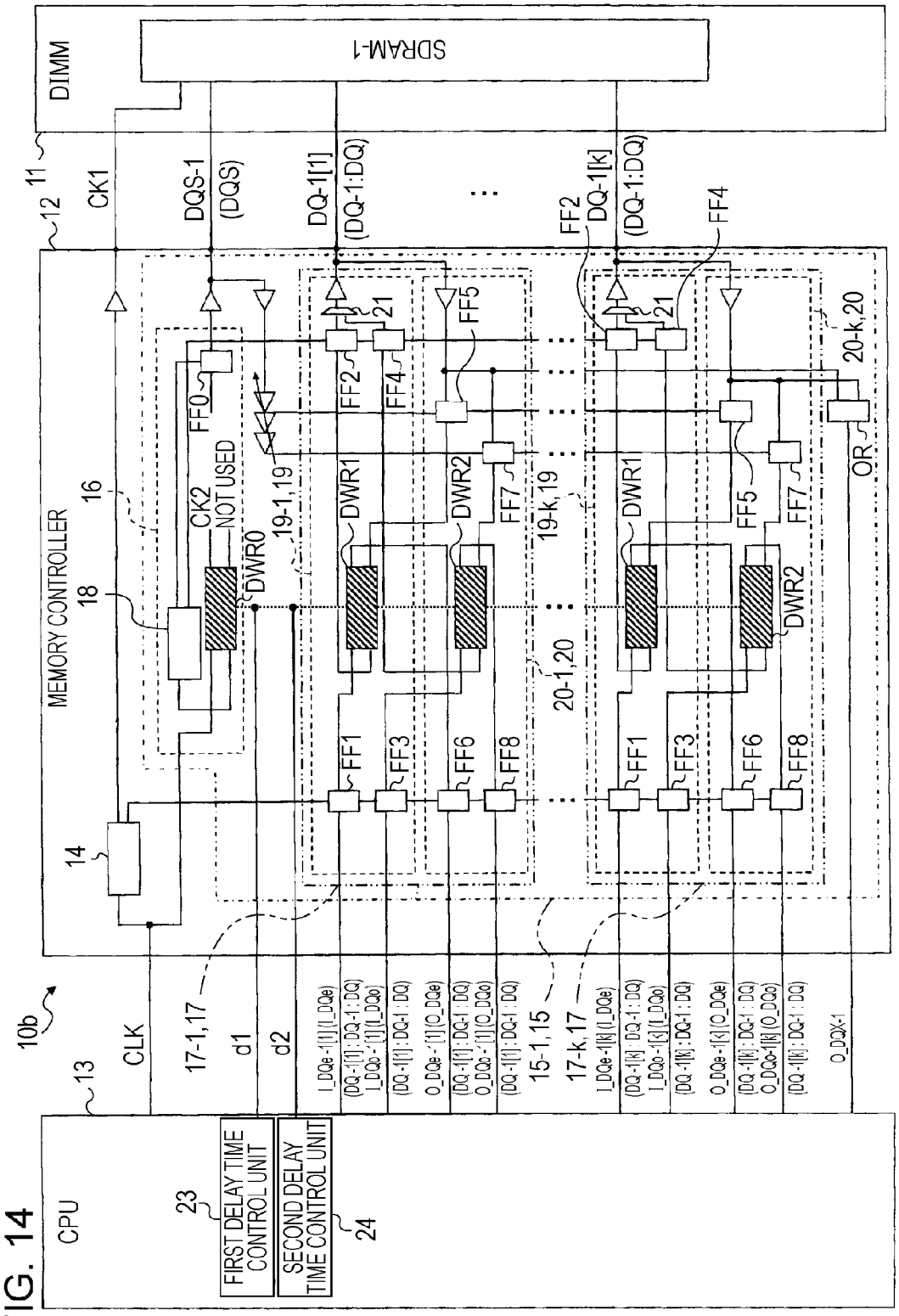
FIG. 14 is a circuit diagram showing a portion of a memory controller, which corresponds to SDRAM-1, in an information processing apparatus according to a second embodiment.
Figure 15:
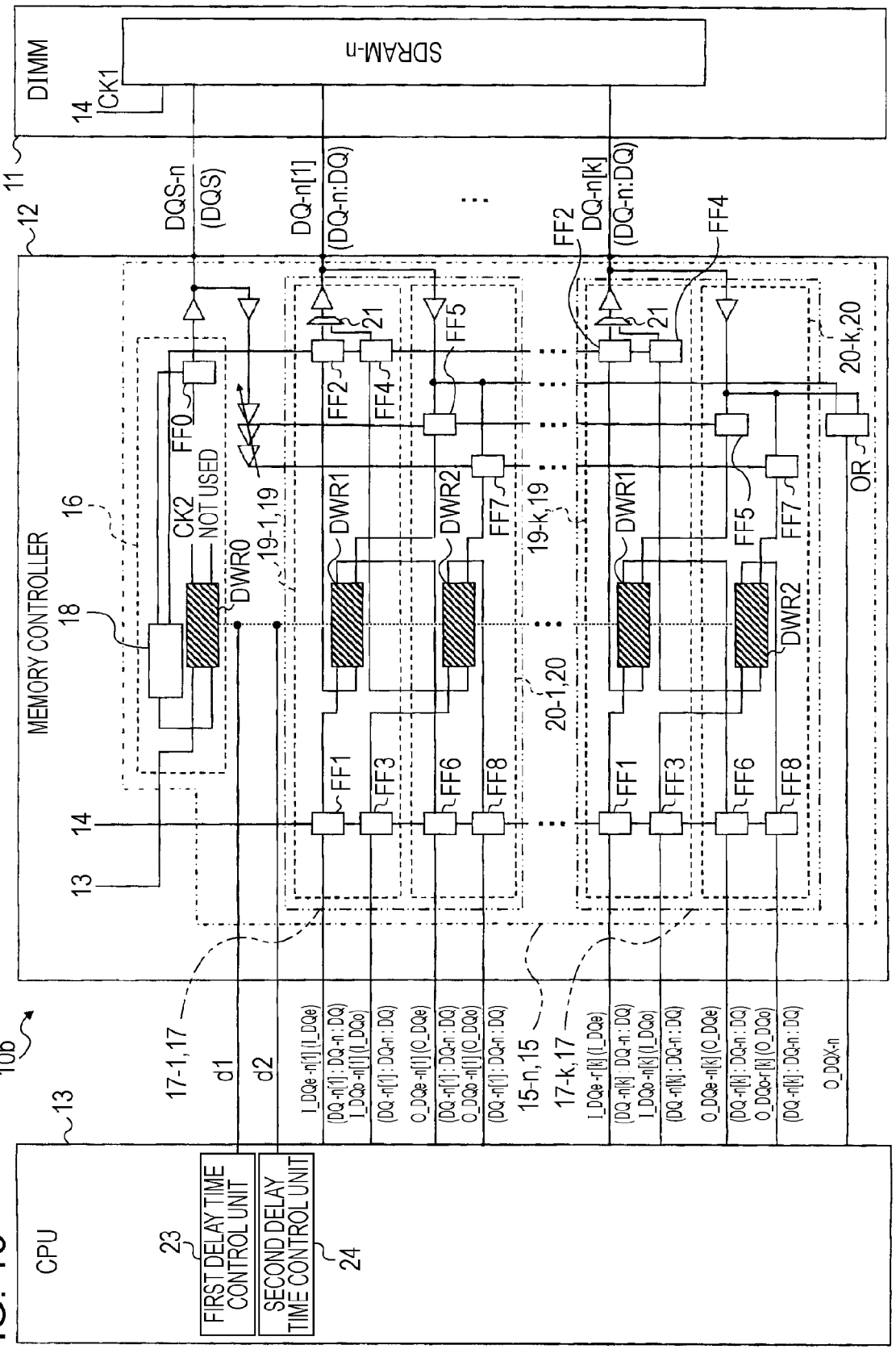
FIG. 15 is a circuit diagram showing a portion of the memory controller, which corresponds to SDRAM-n, in the information processing apparatus according to the second embodiment.
Figure 16:
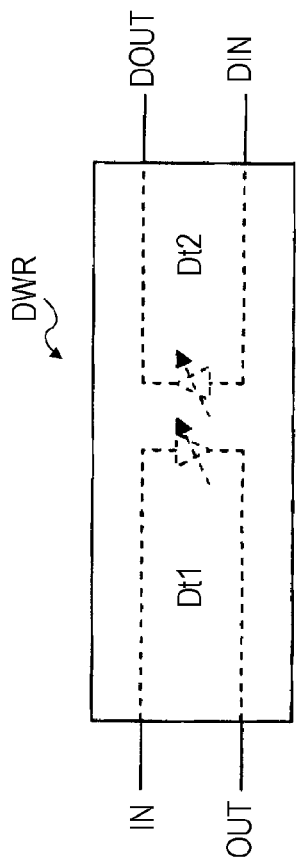
FIG. 16 is a diagram for explaining the function of a third variable delay circuit of the memory controller in the information processing apparatus according to the second embodiment.

FIG. 14 is a circuit diagram showing a portion of a memory controller, which corresponds to the SDRAM-1, in the information processing apparatus according to the second embodiment, FIG. 15 is a circuit diagram showing a portion of the memory controller, which corresponds to SDRAM-n, in the information processing apparatus according to the second embodiment, and FIG. 16 is a diagram for explaining the function of a third variable delay circuit of the memory controller.

As shown in FIGS. 14 and 15, the information processing apparatus 10*b* according to the second embodiment includes a third variable delay circuit DWR0 instead of the first variable delay circuit DW0 included in each of the control circuit units 15-1 to 15-*n* in the first embodiment, a third variable delay circuit DWR1 instead of the first variable delay circuit DW1 and the second variable delay circuit DR1 both included in each of the control circuit units 15-1 to 15-*n* in the first embodiment, and a third variable delay circuit DWR2 instead of the first variable delay circuit DW2 and the second variable delay circuit DR2 both included in each of the control circuit units 15-1 to 15-*n* in the first embodiment. The remaining part of the information processing apparatus 10*b* is constructed similarly to that of the information processing apparatus 10 according to the first embodiment.

Note that because the same characters in FIGS. 14 to 16 as the above-mentioned characters denote the same or essentially the same components, a detailed description thereof is omitted here.

In the following description, regarding characters denoting the third variable delay circuits in the second embodiment, when one among the plurality of third variable delay circuits needs to be specified, any of characters DWR0, DWR1 and DWR2 is used, while just a character DWR is used when an arbitrary third variable delay circuit is to be indicated.

The third variable delay circuit DWR in the second embodiment is a digital delay circuit capable of delaying two signals at the same time. As shown in FIG. 16, the third variable delay circuit DWR has two input terminals IN and DIN and two output terminals OUT and DOUT. A signal input through one input terminal IN is delayed by the first delay time Dt1 which is set by the first delay time control unit 23, and is output from one output terminal OUT, while a signal input through the other input terminal DIN is delayed by the second delay time Dt2 which is set by the second delay time control unit 24, and is output from the other output terminal DOUT.

In the example shown in FIGS. 14 and 15, in the third variable delay circuit DWR0, the clock signal CLK from the CPU 13 is input to one input terminal IN, is delayed by the first delay time Dt1, and is output to the second clock signal generator 18 from the one output terminal OUT. The other input terminal DIN and the other output terminal DOUT are not used.

Also, as shown in FIGS. 14 and 15, in the third variable delay circuit DWR1, the first data signal I_DQe is input to one input terminal IN from the flip-flop FF1, is delayed by the first delay time Dt1, and is output to the flip-flop FF2 from the one output terminal OUT. The third data signal O_DQe is input to the other input terminal DIN from the flip-flop FF5, is delayed by the second delay time Dt2, and is output to the flip-flop FF6 from the other output terminal DOUT.

Further, as shown in FIGS. 14 and 15, in the third variable delay circuit DWR2, the second data signal I_DQo is input to one input terminal IN from the flip-flop FF3, is delayed by the first delay time Dt1, and is output to the flip-flop FF4 from the one output terminal OUT. The fourth data signal O_DQo is input to the other input terminal DIN from the flip-flop FF7, is delayed by the second delay time Dt2, and is output to the flip-flop FF8 from the other output terminal DOUT.

Figure 17:
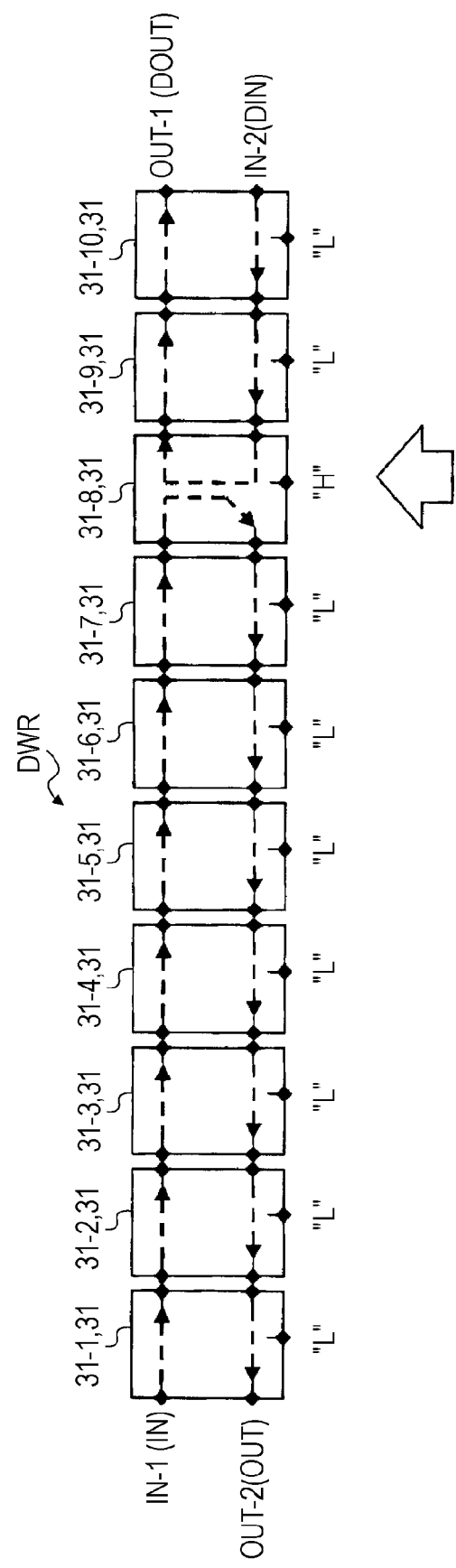
FIG. 17 is a block diagram showing a configuration example of the third variable delay circuit in the information processing apparatus according to the second embodiment.
Figure 18A:
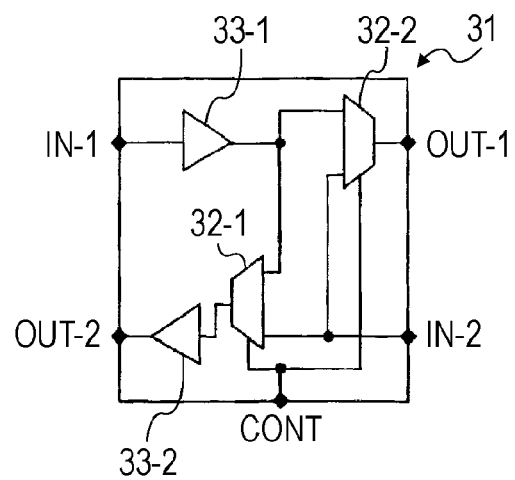
FIGS. 18A to 18C are circuit diagrams each showing a configuration example of a unit circuit of the third variable delay circuit in the information processing apparatus according to the second embodiment.
Figure 18B:
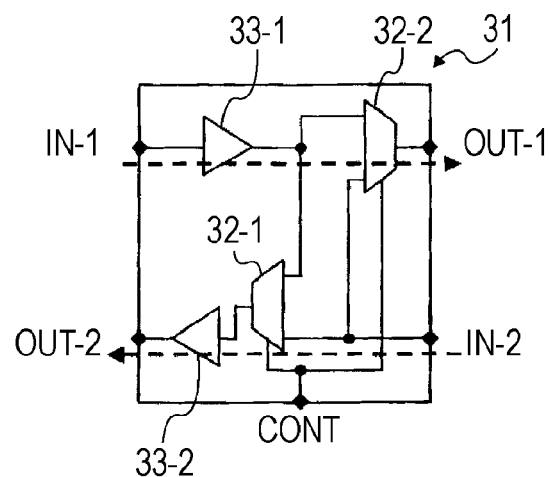
Figure 18C:
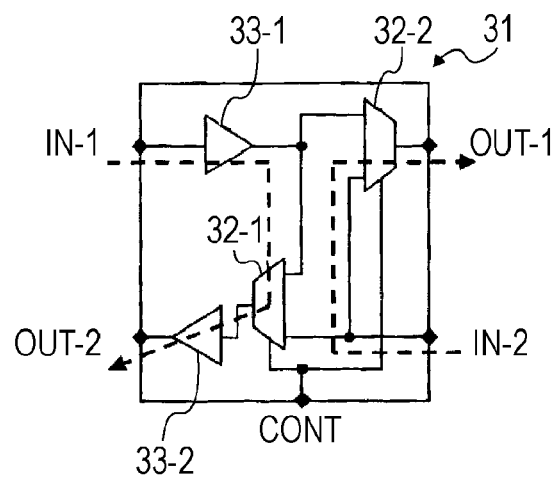

FIG. 17 is a block diagram showing a configuration example of the third variable delay circuit in the information processing apparatus according to the second embodiment, and FIGS. 18A to 18C are circuit diagrams each showing a configuration example of a unit circuit of the third variable delay circuit. Specifically, FIG. 18A is a circuit diagram for explaining the configuration of the unit circuit, FIG. 18B is a circuit diagram for explaining a through operation mode of the unit circuit, and FIG. 18C is a circuit diagram for explaining a feedback operation mode of the unit circuit.

The detailed configuration of the third variable delay circuit DWR will be described below with reference to FIGS. 17 and 18A to 18C.

As shown in FIG. 17, the third variable delay circuit DWR in the second embodiment is constituted by connecting a plurality (ten in the example shown in FIG. 17) of unit circuits 31-1 to 31-10 in series.

In the following description, regarding characters denoting the unit circuits, when one among the plurality of unit circuits needs to be specified, any of characters 31-1 to 31-10 is used, while just a character 31 is used when an arbitrary unit circuit is to be indicated.

The unit circuit 31 is a circuit capable of selectively changing the terminal from which the input signal is to be output. As shown in FIG. 18A, the unit circuit 31 comprises a control signal input terminal CONT, a first selector (selectively changing unit) 32-1, a second selector (selectively changing unit) 32-2, a first input terminal IN-1, a second input terminal IN-2, a first output terminal OUT-1, and a second output terminal OUT-2.

The control signal input terminal CONT is a terminal to which the control signal from the first delay time control unit 23 or the second delay time control unit 24 is input, and which is connected to both the first selector 32-1 and the second selector 32-2 (each being described below).

The first selector 32-1 serves to selectively change an output signal in accordance with the control signal from the control signal input terminal CONT, and it has two input terminals and one output terminal.

The second selector 32-2 serves to selectively change an output signal in accordance with the control signal from the control signal input terminal CONT, and it has two input terminals and one output terminal.

The first input terminal IN-1 is a terminal to which a first signal is input. As shown in FIG. 18A, the first input terminal IN-1 is connected to one input terminal of the first selector 32-1 and one input terminal of the second selector 32-2 through an amplifier 33-1.

The second input terminal IN-2 is a terminal to which a second signal is input. As shown in FIG. 18A, the second input terminal IN-2 is connected to the other input terminal of the first selector 32-1 and the other input terminal of the second selector 32-2.

The first output terminal OUT-1 is a terminal for selectively outputting one of the first signal input to the first input terminal IN-1 and the second signal input to the second input terminal IN-2. As shown in FIG. 18A, the first output terminal IN-2 is connected to an output terminal of the second selector 32-2.

The second output terminal OUT-2 is a terminal for selectively outputting one of the first signal input to the first input terminal IN-1 and the second signal input to the second input terminal IN-2. As shown in FIG. 18A, an output terminal of the first selector 32-1 is connected to the second output terminal OUT-2 through an amplifier 33-2.

Further, the unit circuit 31 is constructed to be capable of selectively operating in one of the through operation mode and the feedback operation mode in accordance with the control signal from the control signal input terminal CONT.

The term "through operation mode" refers to a mode in which, as shown in FIG. 18B, the first signal input through the first input terminal IN-1 is output through the first output terminal OUT-1 and the second signal input through the second input terminal IN-2 is output through the second output terminal OUT-2.

The term "feedback operation mode" refers a mode in which, as shown in FIG. 18C, the first signal input through the first input terminal IN-1 is output through the second output terminal OUT-2 and the second signal input through the second input terminal IN-2 is output through the first output terminal OUT-1.

Further, in the third variable delay circuit DWR, as shown in FIG. 17, the plurality of unit circuits 31-1 to 31-10 are connected in series, and the adjacent unit circuits 31 are connected to each other such that the first input terminal IN-1 is connected to the first output terminal OUT-1 and the second input terminal IN-2 is connected to the second output terminal OUT-2.

Stated another way, in the through operation mode, the first signal input from the unit circuit 31 in the preceding stage is output to the unit circuit 31 in the succeeding stage and the second signal input from the unit circuit 31 in the succeeding stage is output to the unit circuit 31 in the preceding stage. In the feedback operation mode, the first signal input from the unit circuit 31 in the preceding stage is output to the unit circuit 31 in the preceding stage, and the second signal input from the unit circuit 31 in the succeeding stage is output to the unit circuit 31 in the succeeding stage.

Moreover, in the second embodiment, the first delay time control unit 23 executes control to delay the first signal by the first delay time Dt1 by causing the first signal to pass a part of the third variable delay circuit DWR, and the second delay time control unit 24 executes control to delay the second signal by the second delay time Dt2 by causing the second signal to pass a part of the third variable delay circuit DWR.

More specifically, each of the first delay time control unit 23 and the second delay time control unit 24 outputs control signals to the plurality of unit circuits 31-1 to 31-10 for operating one of the unit circuits 31-1 to 31-10 in the feedback operation mode and operating the other unit circuits in the through operation mode based on the first delay time Dt1 and the second delay time Dt2 corresponding to the first delay time Dt1, which are set by the first delay time control unit 23 and the second delay time control unit 24, respectively.

In accordance with the control signals output to the unit circuits 31-1 to 31-10 from each of the first delay time control unit 23 and the second delay time control unit 24, the third variable delay circuit DWR increases and decreases the number of the unit circuits 31 through which the first signal input to the first input terminal IN-1 of the unit circuit 31-1 in the foremost stage or the second signal input to the second input terminal IN-2 of the unit circuit 31-1 in the rearmost stage passes, thereby changing the delay time from the input of the first signal or the second signal to the output thereof.

For example, as shown in FIG. 17, based on the first delay time Dt1 and the second delay time Dt2 which are set by the first delay time control unit 23 and the second delay time control unit 24, respectively, a "Hi" signal is output to the unit circuit 31-8 and a "Low" signal is output to the unit circuits 31-1 to 31-7, 31-9 and 31-10 other than the unit circuit 31-8. In such a case, the third variable delay circuit DWR forms a first signal passage line and a second signal passage line by operating the unit circuit 31-8 in the feedback operation mode and operating the unit circuits 31-1 to 31-7, 31-9 and 31-10 in the through operation mode.

In the first signal passage line, as shown in FIG. 17, the first signal input through the first input terminal IN-1 of the unit circuit 31-1 in the foremost stage successively passes the plurality of unit circuits 31-2 to 31-7, which operate in the through operation mode, from the unit circuit 31-2 to the unit circuit 31-7. After being returned at the unit circuit 31-8 which operates in the feedback operation mode, the first signal successively passes the plurality of unit circuits 31-2 to 31-7, which operate in the through operation mode, from the unit circuit 31-7 to the unit circuit 31-2. Finally, the first signal is output from the second output terminal OUT-2 of the unit circuit 31-1 in the foremost stage.

In the second signal passage line, as shown in FIG. 17, the second signal input through the second input terminal IN-2 of the unit circuit 31-10 in the rearmost stage passes the unit circuit 31-9 which operates in the through operation mode. After being returned at the unit circuit 31-8 which operates in the feedback operation mode, the second signal passes the unit circuit 31-9 which operates in the through operation mode. Then, the second signal is output from the first output terminal OUT-1 of the unit circuit 31-10 in the rearmost stage.

As a result, the third variable delay circuit DWR disposed corresponding to each of the SDRAM-1 to the SDRAM-n executes the control such that the sum of the first delay time Dt1 and the second delay time Dt2 is kept constant.

Thus, the information processing apparatus 10b according to the second embodiment can provide the following advantages in addition to similar working advantages to those of the above-described first embodiment. By using the unit circuits 31 constituted to be capable of selectively operating in the through operation mode in which the signal input from the unit circuit 31 in the preceding stage is output to the unit circuit 31 in the succeeding stage and the signal input from the unit circuit 31 in the succeeding stage is output to the unit circuit 31 in the preceding stage and in the feedback operation mode in which the signal input from the unit circuit 31 in the preceding stage is output to the unit circuit 31 in the preceding stage and the signal input from the unit circuit 31 in the succeeding stage is output to the unit circuit 31 in the succeeding stage, those two signals can be simultaneously delayed by the respective delay times Dt1 and Dt2 from the input of the two signals to the output thereof. Accordingly, the delay times Dt1 and Dt2 from the input of the two signals to the output thereof can be efficiently set without increasing the power consumption and the area occupied by the apparatus.

Also, by operating at least one unit circuit 31 among the plurality of unit circuits 31-1 to 31-10 in the feedback operation mode, the respective delay times Dt1 and Dt2 of the two signals can be easily set while holding constant the sum of the respective delay times Dt1 and Dt2 of the two signals.

Further, by executing the control such that the sum of the first delay time Dt1 of the first signal and the second delay time Dt2 of the second signal is equal to a preset value, or such that the sum of the first delay time Dt1 of the first signal and the second delay time Dt2 of the second signal is held constant, the respective delay times Dt1 and Dt2 of the two signals can be easily set while holding constant the sum of the respective delay times Dt1 and Dt2 of the two signals.

[4] Modification of Second Embodiment

A modification of the information processing apparatus 10b according to the second embodiment will be described below with reference to FIGS. 19 and 20.

Figure 19:
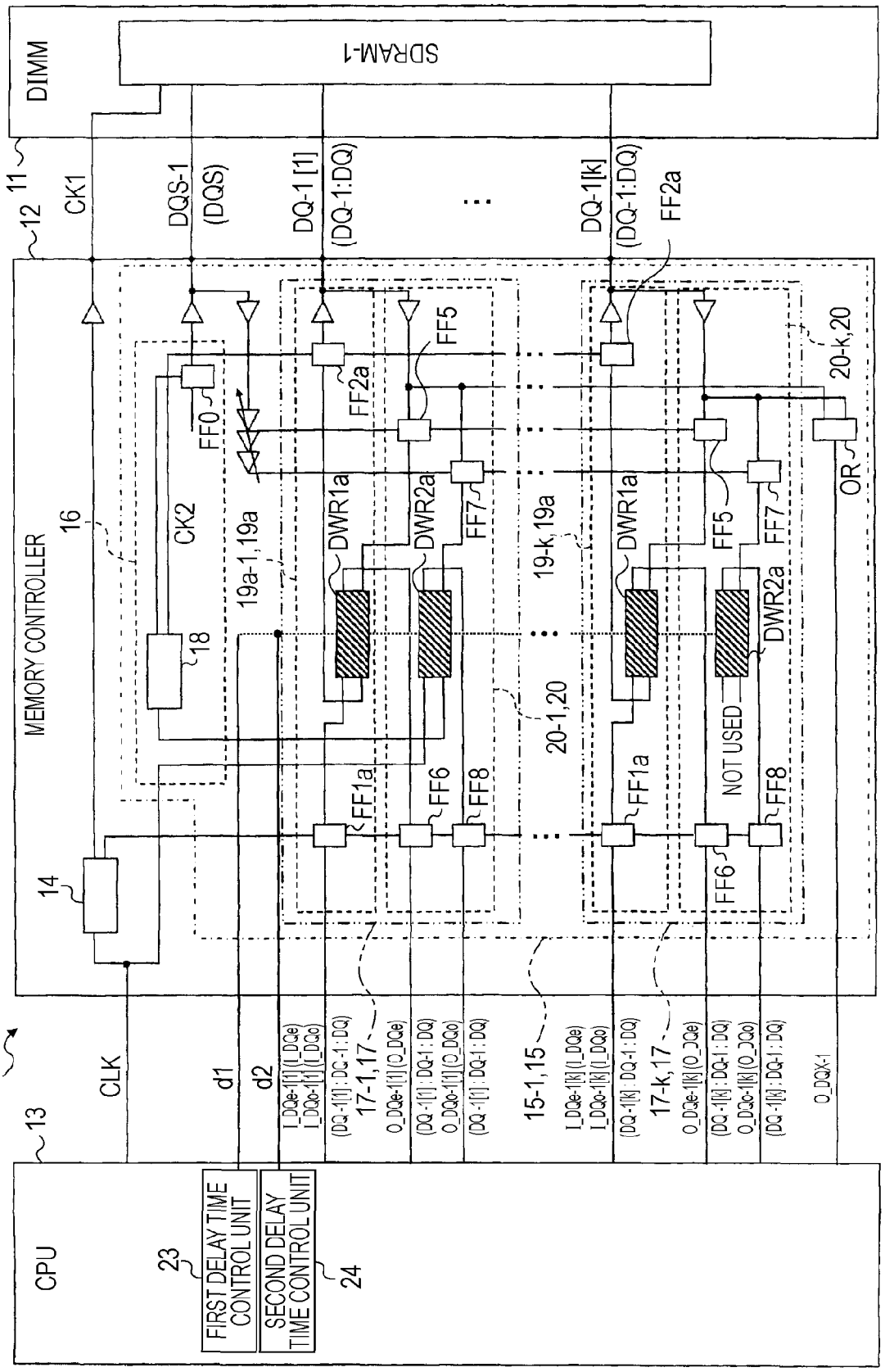
FIG. 19 is a circuit diagram showing a portion of the memory controller, which corresponds to the SDRAM-1, in the information processing apparatus according to a modification of the second embodiment.
Figure 20:
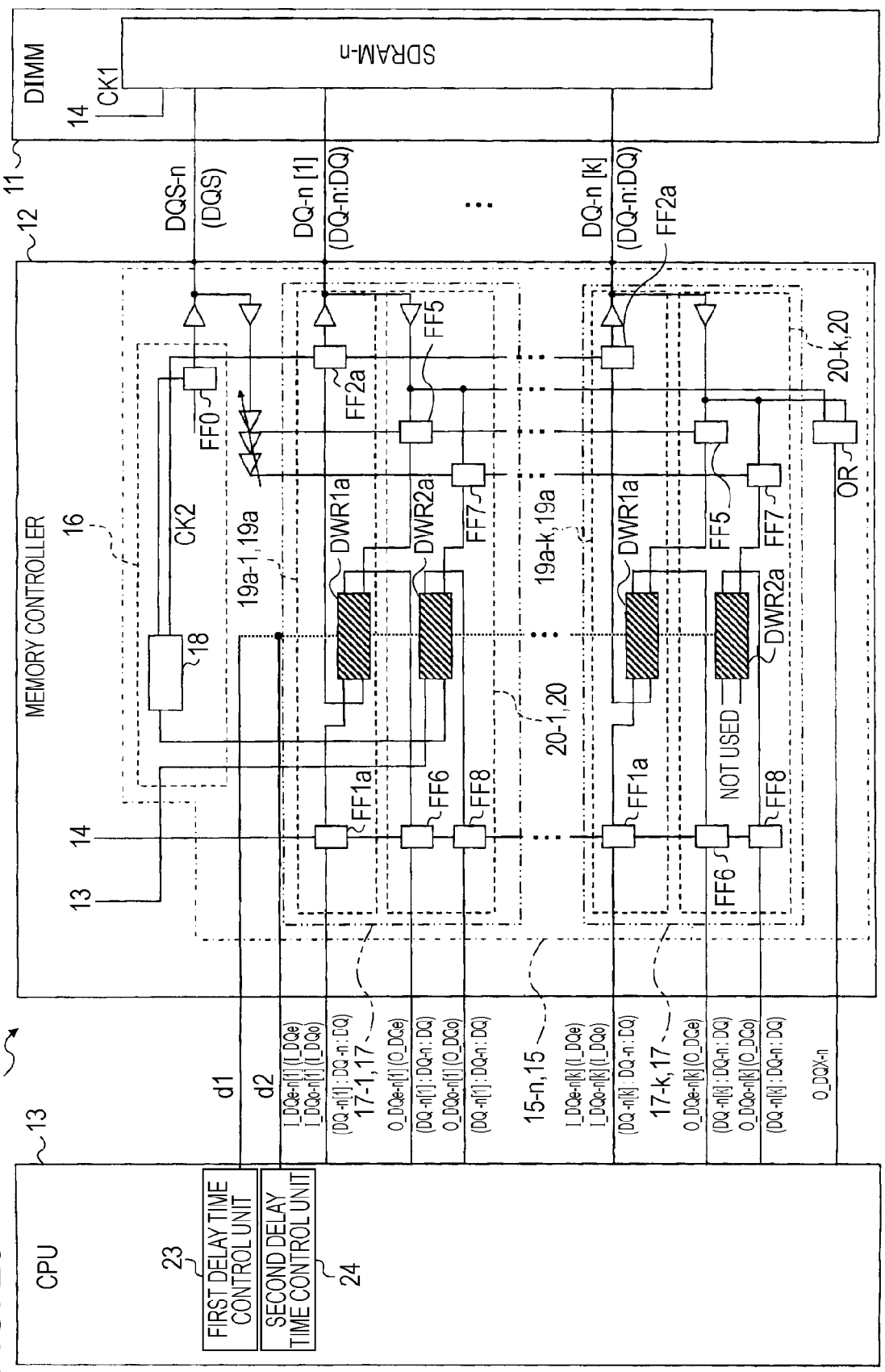
FIG. 20 is a circuit diagram showing a portion of the memory controller, which corresponds to the SDRAM-n, in the information processing apparatus according to the modification of the second embodiment.

FIG. 19 is a circuit diagram showing a portion of the memory controller, which corresponds to the SDRAM-1, in the information processing apparatus according to a modification of the second embodiment, and FIG. 20 is a circuit diagram showing a portion of the memory controller, which corresponds to the SDRAM-n, in the information processing apparatus according to the modification.

As shown in FIGS. 19 and 20, an information processing apparatus 10c according to the modification of the second embodiment includes, as in the modification of the first embodiment, DQ signal input control units 19a-1 to 19a-k instead of the DQ signal input control units 19-1 to 19-k in each of the control circuit units 15-1 to 15-n in the second embodiment. Correspondingly, the information processing apparatus 10c includes third variable delay circuits DWR1a and DWR2a instead of the third variable delay circuits DWR0, DWR1 and DWR2 in each of the control circuit units 15-1 to 15-n in the second embodiment. The remaining part of the information processing apparatus 10c is constructed similarly to that of the information processing apparatus 10a according to the modification of the first embodiment or the information processing apparatus 10b according to the second embodiment.

Note that because the same characters in FIGS. 19 and 20 as the above-mentioned characters denote the same or essentially the same components, a detailed description thereof is omitted here.

In the following description, regarding characters denoting the third variable delay circuits in the modification of the second embodiment, when one among the plurality of third variable delay circuits needs to be specified, any of characters DWR1a and DWR2a is used, while just a character DWR is used when an arbitrary third variable delay circuit is to be indicated.

The third variable delay circuit DWR in the modification of the second embodiment has a similar function and configuration to those in the above-described third variable delay circuit DWR in the second embodiment, and a detailed description thereof is omitted here.

In the third variable delay circuit DWR1a, as shown in FIGS. 19 and 20, the first data signal I_DQe or the second data signal I_DQo is input from the flip-flop FF1a to one input terminal IN of the third variable delay circuit DWR1a, is delayed by the first delay time Dt1, and is output to the flip-flop FF2a from one output terminal OUT of the third variable delay circuit DWR1a. The third data signal O_DQe is input from the flip-flop FF5 to the other input terminal DIN of the third variable delay circuit DWR1a, is delayed by the second delay time Dt2, and is output to the flip-flop FF6 from the other output terminal DOUT of the third variable delay circuit DWR1a.

In the third variable delay circuit DWR2a included in the DQ signal control unit 17-1, as shown in FIGS. 19 and 20, the clock signal CLK is input from the CPU 13 to one input terminal IN of the third variable delay circuit DWR2a, is delayed by the first delay time Dt1, and is output to the second clock signal generator 18 from one output terminal OUT of the third variable delay circuit DWR2a. The fourth data signal O_DQo is input from the flip-flop FF7 to the other input terminal DIN of the third variable delay circuit DWR2a, is delayed by the second delay time Dt2, and is output to the flip-flop FF8 from the other output terminal DOUT of the third variable delay circuit DWR2a.

In the third variable delay circuit DWR2a included in each of the DQ signal control units 17-2 to 17-n other than the DQ signal control unit 17-1, as shown in FIGS. 19 and 20, one input terminal DIN and one output terminal DOUT thereof are not used. The fourth data signal O_DQo is input from the flip-flop FF7 to the other input terminal DIN of the third variable delay circuit DWR2a, is delayed by the second delay time Dt2, and is output to the flip-flop FF8 from the other output terminal DOUT of the third variable delay circuit DWR2a.

Thus, the information processing apparatus 10c according to the modification of the second embodiment can also provide similar working advantages to those in the second embodiment.

[5] Other Modifications

It should be understood that the circuit etc. is not limited to the above-described embodiments, and the circuit etc. can be implemented in the form of various modifications without departing from the scope.

For example, the memory controller 12 is not limited to the circuits described in the foregoing embodiments, and the circuit etc. can be similarly applied to various types of known DDR3 memory interfaces which are capable of incorporating the first variable delay circuit DW, the second variable delay circuit DR, and the third variable delay circuit DWR.

While the second embodiment has been described above in connection with an example in which the third variable delay circuit DWR disposed corresponding to each of the SDRAM-1 to the SDRAM-n executes the control such that the sum of the first delay time Dt1 and the second delay time Dt2 is held constant, the circuit etc. is not limited to such an example. For example, if the sum of the first delay time Dt1 and the second delay time Dt2 is equal to or less than a maximum delay time in the third variable delay circuit DWR, the control may be executed such that the sum of the first delay time Dt1 and the second delay time Dt2 is equal to a desired preset value.

Figure 21:
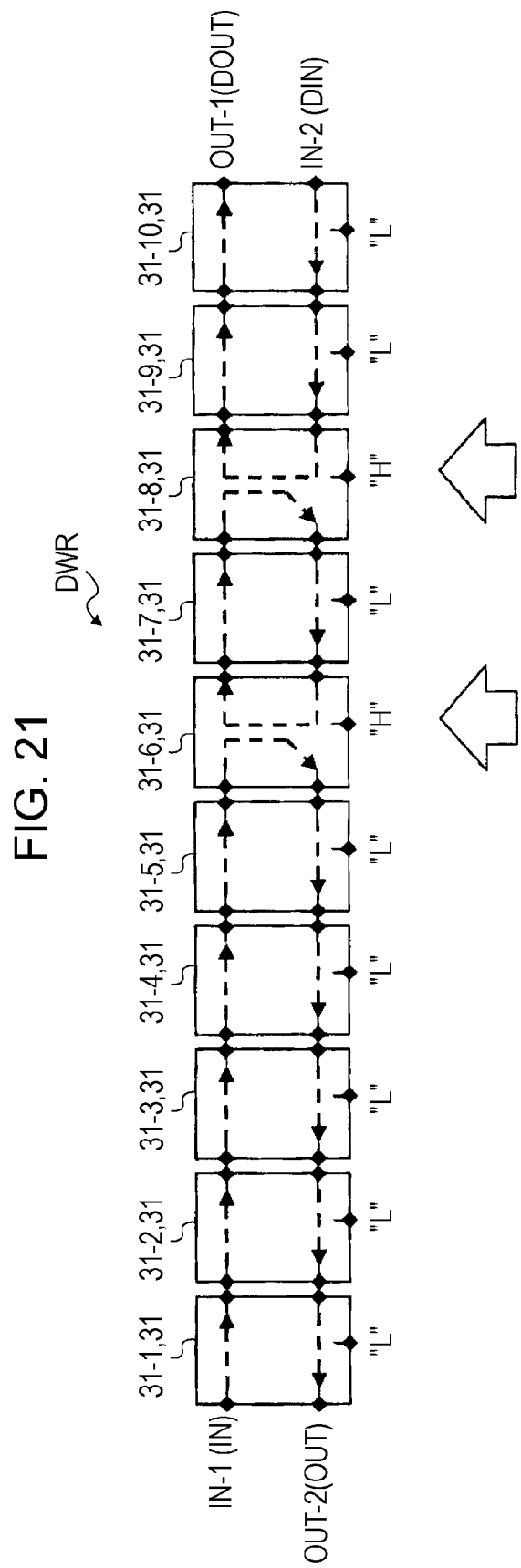
FIG. 21 is a block diagram for explaining another example of use of the third variable delay circuit in the information processing apparatus according to the second embodiment.

FIG. 21 is a block diagram for explaining another example of use of the third variable delay circuit in the information processing apparatus according to the second embodiment.

While the second embodiment has been described above in connection with an example of outputting, to the plurality of unit circuits 31-1 to 31-10, the control signals to operate one of the unit circuits 31-1 to 31-10 in the feedback operation mode and to operate the remaining unit circuits in the through operation mode, the circuit etc. is not limited to such an arrangement. For example, as shown in FIG. 21, the control signals may be output to the plurality of unit circuits 31-1 to 31-10 to operate plural ones 31-6 and 31-8 of the unit circuits 31-1 to 31-10 in the feedback operation mode. In such a case, as shown in FIG. 21, in a first signal passage line, the first signal input from the unit circuit 31-1 in the foremost stage is returned at the unit circuit 31-6 operating in the feedback operation mode, which is positioned closer to the unit circuit 31-1 in the foremost stage than the other unit circuit operating in the feedback operation mode. Then, the first signal is output from the unit circuit 31-1 in the foremost stage. In a second signal passage line, the second signal input from the unit circuit 31-10 in the rearmost stage is returned at the unit circuit 31-8 operating in the feedback operation mode, which is positioned closer to the unit circuit 31-10 in the rearmost stage than the other unit circuit operating in the feedback operation mode. Then, the second signal is output from the unit circuit 31-10 in the rearmost stage. In such a manner, the sum of the respective delay times of the two signals can be easily changed depending on temperature and voltage.

The CPU 13 functions as the first delay time control unit 23 and the second delay time control unit 24 by executing a delay time control program.

A program for realizing the functions of the first delay time control unit 23 and the second delay time control unit 24 (i.e., the delay time control program) is provided in the form recorded on a computer readable recording medium, such as a flexible disk, a CD (e.g., CD-ROM, CD-R, and CD-RW), a DVD (e.g., DVD-ROM, DVD-RAM, DVD-R, DVD+R, DVD-RW, DVD+RW, and HD-DVD), a Blu-ray disc, a magnetic disk, an optical disk, or a magneto-optical disk. In use, a computer reads the program from the recording medium and transfers the program to be loaded in an internal storage unit or an external storage unit. As an alternative, the program may be recorded on a storage unit (recording medium), such as a magnetic disk, an optical disk, or a magneto-optical disk, and may be provided to the computer from the storage unit via a communication path.

When carrying out the functions of the first delay time control unit 23 and the second delay time control unit 24, the program loaded in the internal storage unit is executed by a microprocessor in the computer. As an alternative, the computer may read and execute the program recorded on the recording medium.

In the embodiments, the term "computer" represents the concept including hardware and an operating system, and it refers to hardware operating under control of the operating system. Also, when hardware is operated by an application program alone without using the operating system, the hardware itself corresponds to the computer. The hardware comprises at least a microprocessor, such as a CPU, and a means for reading a computer program recorded on a recording medium. In the embodiments, each of the information processing apparatuses 10, 10a, 10b and 10c has the function of the computer.

The recording medium used in the embodiments is not limited to the above-described examples including a flexible disk, a CD, a DVD, a Blu-ray disc, a magnetic disk, an optical disk, and a magneto-optical disk. In addition, other various types of computer-readable media are also usable which include an IC card, a ROM cartridge, a magnetic tape, a punched card, an internal storage unit (e.g., a memory such as RAM or ROM) of a computer, an external storage unit, and a print on which a code, such as a barcode, is printed.

Thus, the embodiments can be implemented in computing hardware and/or software, such as (in a non-limiting example) any computing circuitry, computer that can store, retrieve, process and/or output data and/or communicate with other computers. The results produced can be displayed on a display of the computing hardware. A program/software implementing the embodiments may be recorded on computer-readable media comprising computer-readable recording media. The program/software implementing the embodiments may also be transmitted over transmission communication media. An example of transmission communication media includes a carrier-wave signal.

Further, according to an aspect of the embodiments of the invention, any combinations of the described features, functions, operations, and/or benefits can be provided.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A memory control circuit having a write leveling function and controlling read/write operations by supplying a clock signal to a plurality of memories through a clock signal line which is wired to the plurality of memories through daisy chain connection, the memory control circuit comprising:
for each of the plurality of memories:
a first variable delay unit delaying, in a write operation, a data strobe signal output to the memory by a first delay time that is set by utilizing the write leveling function; and
a second variable delay unit delaying, in a read operation, a data signal input from the memory by a second delay time that is set based on the first delay time,
wherein
the first variable delay unit is constituted by a digital delay circuit which is made up of a plurality of unit circuits connected in series and which delays the data signal output to the memory by the first delay time by passing the data signal through a predetermined number of the unit circuits; and
the second variable delay unit is constituted by the digital delay circuit which is made up of the plurality of unit circuits connected in series and which delays the data signal input from the memory by the second delay time by passing the data signal through a predetermined number of the unit circuits.

2. The memory control circuit according to claim 1, wherein a plurality of data signal lines connecting the memory control circuit and the plurality of memories are formed in same length.

3. The memory control circuit according to claim 2, wherein the second delay time corresponding to one of the memories is set such that a sum of the first delay time and the second delay time both corresponding to the one memory is equal to a preset value.

4. The memory control circuit according to claim 2, wherein the second delay time corresponding to one of the memories is set such that a sum of the first delay time and the second delay time both corresponding to the one memory is equal to a sum of the first delay time and the second delay time both corresponding to another one of the memories.

5. The memory control circuit according to claim 2, wherein the second delay time corresponding to one of the memories is set to be a difference between the first delay time corresponding to the one memory and a maximum delay time from among the plurality of first delay times corresponding to the plurality of memories.

6. The memory control circuit according to claim 1, wherein the first variable delay unit and the second variable delay unit are each constituted by a digital delay circuit.

7. A delay time control device setting a signal delay time in a memory control circuit having a write leveling function and controlling read/write operations by supplying a clock signal to a plurality of memories through a clock signal line which is wired to the plurality of memories through daisy chain connection, the delay time control device comprising:
a first delay time controller setting a first delay time of a data strobe signal, which is output to each memory in a write operation, corresponding to each of the plurality of memories by utilizing the write leveling function; and
a second delay time controller setting, based on the first delay time set by the first delay time controller, a second delay time of a data signal, which is input from each memory in a read operation, corresponding to each of the plurality of memories,
wherein
the first delay time controller delays the data signal output to the memory by the first delay time by passing the data signal through a part of a digital delay circuit which is made up of a plurality of unit circuits connected in series; and
the second delay time controller delays the data signal input from the memory by the second delay time by passing the data signal through a part of the digital delay circuit which is made up of the plurality of unit circuits connected in series.

8. The delay time control device according to claim 7, wherein a plurality of data signal lines connecting the memory control circuit and the plurality of memories are formed in a same length.

9. The delay time control device according to claim 8, wherein the second delay time controller sets the second delay time corresponding to one of the memories such that a sum of the first delay time and the second delay time both corresponding to the one memory is equal to a preset value.

10. The delay time control device according to claim 8, wherein the second delay time controller sets the second delay time corresponding to one of the memories such that a sum of the first delay time and the second delay time both corresponding to the one memory is equal to a sum of the first delay time and the second delay time both corresponding to another one of the memories.

11. The delay time control device according to claim 8, wherein the second delay time controller sets, as the second delay time corresponding to one of the memories, a difference between the first delay time corresponding to the one memory and a maximum delay time from among the plurality of first delay times corresponding to the plurality of memories.

12. A delay time control method for setting a signal delay time in a memory control circuit having a write leveling function and controlling read/write operations by supplying a clock signal to a plurality of memories through a clock signal line which is wired to the plurality of memories through daisy chain connection, the delay time control method comprising:

setting a first delay time of a data strobe signal, which is output to each memory in a write operation, corresponding to each of the plurality of memories by utilizing the write leveling function; and setting, based on the first delay time set, a second delay time of a data signal, which is input from each memory in a read operation, corresponding to each of the plurality of memories, wherein the first delay time setting delays the data signal output to the memory by the first delay time by passing the data signal through a part of a digital delay circuit which is made up of a plurality of unit circuits connected in series; and the second delay time setting delays the data signal input from the memory by the second delay time by passing the data signal through a part of the digital delay circuit which is made up of the plurality of unit circuits connected in series.

13. The delay time control method according to claim 12, wherein a plurality of data signal lines connecting the memory control circuit and the plurality of memories are formed in a same length.

14. The delay time control method according to claim 13, wherein, in the second delay time setting, the second delay time corresponding to one of the memories is set such that a sum of the first delay time and the second delay time both corresponding to the one memory is equal to a preset value.

15. The delay time control method according to claim 13, wherein, in the second delay time setting, the second delay time corresponding to one of the memories is set such that a sum of the first delay time and the second delay time both corresponding to the one memory is equal to a sum of the first delay time and the second delay time both corresponding to another one of the memories.

16. The delay time control method according to claim 13, wherein, in the second delay time setting, the second delay time corresponding to one of the memories is set to be a difference between the first delay time corresponding to the one memory and a maximum delay time from among the plurality of first delay times corresponding to the plurality of memories.

* * * * *